US006973001B1

(12) United States Patent
Tomita

(10) Patent No.: US 6,973,001 B1
(45) Date of Patent: Dec. 6, 2005

(54) SEMICONDUCTOR INTEGRATED CIRCUIT CAPABLE OF ADJUSTING THE OPERATION TIMING OF AN INTERNAL CIRCUIT BASED ON OPERATING ENVIRONMENTS

(75) Inventor: Hiroyoshi Tomita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/036,393

(22) Filed: Jan. 18, 2005

(30) Foreign Application Priority Data

Sep. 28, 2004 (JP) ............................ 2004-281722

(51) Int. Cl.7 ................................................ G11C 7/04

(52) U.S. Cl. ................ 365/194; 365/233; 365/230.08; 365/230.02; 365/189.05

(58) Field of Search ............................... 365/194, 191, 365/230.08, 233, 230.02, 189.05

(56) References Cited

U.S. PATENT DOCUMENTS 5,708,684 A * 1/1998 Ueda .......................... 375/358
6,757,212 B2 * 6/2004 Hamamoto et al. ......... 365/233
2002/0141280 A1 * 10/2002 Haramoto et al. .......... 365/233

FOREIGN PATENT DOCUMENTS

JP 09-116342 5/1997 .......... H03D 13/00
JP 2003-163584 6/2003 ............ H03K 5/13

* cited by examiner

*Primary Examiner*—Andrew Q. Tran
(74) *Attorney, Agent, or Firm*—Arent Fox PLLC

(57) ABSTRACT

The gates of each pair of second transistors receive a pair of delayed timing signals whose rising and falling edges are adjacent to each other, respectively, and gradually discharge the charges at a first node pre-charged to a first power supply voltage. The discharge speed varies depending on the threshold voltage, operating temperature, and power supply voltage of the transistors. A plurality of detection circuits operates at timings different from each other to detect the voltage at the first node as logic values. A selector selects any one of the second timing signals depending on a detection result provided by the detection circuit. An internal circuit operates in synchronization with the second timing signal selected. Accordingly, the operation timing of the internal circuit can be optimally adjusted in response to a change in operating environments. This allows the improvement in operation margin of the semiconductor integrated circuit.

13 Claims, 21 Drawing Sheets

SEMICONDUCTOR INTEGRATED CIRCUIT CAPABLE OF ADJUSTING THE OPERATION TIMING OF AN INTERNAL CIRCUIT BASED ON OPERATING ENVIRONMENTS

CROSS-REFERENCE TO RELATED APPLICATIONS

This application is based upon and claims the benefit of priority from Japanese Patent Application No. 2004-281722, filed on Sep. 28, 2004, the entire contents of which are incorporated herein by reference.

BACKGROUND OF THE INVENTION

1. Field of the Invention

The present invention relates to a semiconductor integrated circuit which includes a timing adjustment circuit for adjusting the operation timing of an internal circuit.

2. Description of the Related Art

The timing adjustment circuit built in a semiconductor integrated circuit adjusts the delay time of a timing signal such as clocks to adjust the operation timing of the internal circuit. For example, the timing adjustment circuit has a cascade connection of delay stages. The timing adjustment circuit uses a delay control signal to select any one of delayed timing signals that are sequentially output from the delay stages, and then outputs the selected delayed timing signal to the internal circuit. The delay control signal is generated within the semiconductor integrated circuit (for example, Japanese Unexamined Patent Application Publication No. 2003-163584).

One timing adjustment circuit of this type includes a pMOS transistor for pre-charging an output node and a plurality of pairs of nMOS transistors for discharging the output node. The gates of each pair of nMOS transistors are coupled to any one delay control signal of a plurality of bits and any one output of the delay stages, respectively. The pMOS transistor and a pair of nMOS transistors selected by the delay control signal are used to charge or discharge the output node, thereby generating a delayed timing signal at the output node.

On the other hand, a circuit technique has been suggested which employs a pMOS transistor for pre-charging an output node and a pair of nMOS transistors for discharging the output node to detect a phase difference between two signals (e.g., Japanese Unexamined Patent Application Publication No. Hei 9-116342). In this circuit, the gate of the pMOS transistor receives a pre-charge signal, while the gates of the pair of nMOS transistors receive two signals for detecting a phase difference, respectively.

The aforementioned delay control signal is generally pre-generated using a fuse or the like. For this reason, when a change occurs in operating temperature or operating voltage of a semiconductor integrated circuit, the operation timing of an internal circuit cannot be adjusted following this change. In other words, there exists no circuit which detects and sets an optimum operation timing in response to the operating environment of the semiconductor integrated circuit.

SUMMARY OF THE INVENTION

It is an object of the present invention to automatically adjust the operation timing of an internal circuit in response to a change in threshold voltage, operating temperature, and power supply voltage. The invention is thus intended to improve the operation margin of a semiconductor integrated circuit to provide improved manufacturing yields. The invention is also intended to improve the operation margin of a system having access to a semiconductor integrated circuit.

According to one of the aspects of the present invention, a first transistor is disposed between a first node and a first power supply line to pre-charge the first node to a first power supply voltage. Each of a plurality of pairs of second transistors is disposed between the first node and a second power supply line in series. A timing signal delaying circuit has a plurality of delay stages connected in cascade to generate a plurality of delayed timing signals obtained by sequentially inverting a first timing signal received at a first stage. The gates of each of the pairs of second transistors receive one and the other of a pair of the delayed timing signals whose rising edge and falling edge are adjacent to each other, respectively, and sequentially discharge the charge at the first node pre-charged to the first power supply voltage. The pair of second transistors receives the pair of delayed timing signals which are different from each other. A plurality of detection circuits operates at timings different from each other, each of which detects the voltage at the first node being discharged as a logic value. A selector selects any one of a plurality of second timing signals depending on a detection result provided by the detection circuits. An internal circuit operates in synchronization with a second timing signal selected by the selector.

The speed of discharging the first node varies depending on the threshold voltage of the transistors constituting the semiconductor integrated circuit, the operating temperature of the semiconductor integrated circuit, or the power supply voltage supplied to the semiconductor integrated circuit. For this reason, the operation timing of the internal circuit can be set automatically optimally depending on the threshold voltage, the operating temperature, and the power supply voltage. Each pair of second transistors is turned on during the overlapping active periods of a pair of delayed timing signals with a rising edge and a falling edge adjacent to each other. The ON period is short, allowing the charge at the first node to be gradually removed. Since the rate of change in voltage at the first node can be reduced, it is possible to adjust the operation timing of the internal circuit in response to a subtle change in threshold voltage, operating temperature, and power supply voltage. This leads to improvements in operation margin of the semiconductor integrated circuit and in manufacturing yields. It is also possible to improve the operation margin of a system accessing the semiconductor integrated circuit.

In a preferred example according to one of the aspects of the present invention, a sampling signal delaying circuit sequentially delays the first timing signal to generate a plurality of sampling timing signals. The detection circuits detect a voltage at the first node as a logic value in synchronization with the sampling timing signals different from each other, respectively. This makes it possible to combine the logic values detected by the detection circuits to facilitate the determination of the speed of discharging the first node.

In a preferred example according to one of the aspects of the present invention, a plurality of latch circuits is disposed between the detection circuits and the selector to latch a detection result provided by the detection circuits. The latch circuits can hold the detection result, thereby allowing the detection circuits to start preparing for the subsequent detection operation before the selector selects the second timing signal. Accordingly, it is possible to shorten the detection cycle, and thus the time required from a change in operating temperature and power supply voltage until the operation timing of the internal circuit is changed.

In a preferred example according to one of the aspects of the present invention, the latch circuits latch a detection result provided by the detection circuits in synchronization with a sampling end signal or the latest one of the sampling timing signals. The latch circuits can operate after the detection operations of all the detection circuits have been completed, thereby ensuring latching of the detection result.

In a preferred example according to one of the aspects of the present invention, the sampling signal delaying circuit sequentially generates the sampling timing signals during a first level period of the clock signal or a first timing signal. The selector selects any one of the second timing signals during a second level period of the clock signal. The internal circuit operates in synchronization with the second timing signal selected by the selector from a first level period subsequent to the second level period during which the second timing signal is selected. That is, during one cycle of the clock signal, it is possible to detect the voltage level at the first node as a logic value, and select the second timing signal depending on the detection result. Accordingly, it is possible to shorten the detection cycle, and thus the time required from a change in operating temperature and power supply voltage until the operation timing of the internal circuit is changed.

In a preferred example according to one of the aspects of the present invention, an encoder is disposed between the detection circuits and the latch circuits to encode a detection result provided by the detection circuits to enable any one of a plurality of encode signals and output the plurality of encode signals to the latch circuits, respectively. A disable timing delaying circuit of the encoder delays a disable timing of an enabled encode signal relative to an enable timing of an encode signal to be enabled. This allows any one of the encode signals to be always enabled. It is thus possible to prevent the selector from selecting none of the second timing signals. As a result, it is possible to prevent the malfunction of the semiconductor integrated circuit caused by the internal circuit not operating.

In a preferred example according to one of the aspects of the present invention, an enable circuit receives an enable signal during the first level period of the first timing signal or a clock signal and outputs the received enable signal during the second level period of the clock signal. The sampling signal delaying circuit or the timing signal delaying circuit starts operating in response to the enable signal output by the enable circuit. Since the sampling signal delaying circuit or the timing signal delaying circuit starts no operation until the enable signal is received, it is possible to reduce the power consumption of the semiconductor integrated circuit.

In a preferred example according to one of the aspects of the present invention, the detection circuits detect a voltage at the first node as logic values in synchronization with the delayed timing signals different from each other. The delayed timing signals generated to be supplied to the gates of a pair of second transistors can be used also as the operating signal of the detection circuits, thereby reducing the circuit scale and the costs of chips of the semiconductor integrated circuit.

In a preferred example according to one of the aspects of the present invention, the second timing signals received by the selector is the delayed timing signals. The delayed timing signal generated to be supplied to the gates of a pair of second transistors can be used also as the second timing signal selected by the selector, thereby reducing the circuit scale and the costs of chips of the semiconductor integrated circuit.

In a preferred example according to one of the aspects of the present invention, the detection circuit includes a transistor with the gate connected to the first node and the drain outputting a voltage corresponding to the logic value. The transistor has a threshold voltage (absolute value) set to be lower than a threshold voltage of other transistors formed in the semiconductor integrated circuit. This makes it possible to reduce the detection time required by the detection circuits and thus prevent the output from being not at a high level nor low level.

In a preferred example according to one of the aspects of the present invention, the first timing signal is a clock signal. That is, the present invention is applicable to a semiconductor integrated circuit which operates in synchronization with a clock signal.

In a preferred example according to one of the aspects of the present invention, the internal circuit is a data output circuit for outputting data, the data being read out of the memory cells in a memory core, in synchronization with the second timing signal selected. The present invention can be applied to a semiconductor memory to adjust the operation timing of a data output circuit, thereby providing an improved operating margin to the semiconductor memory.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Figure 1:
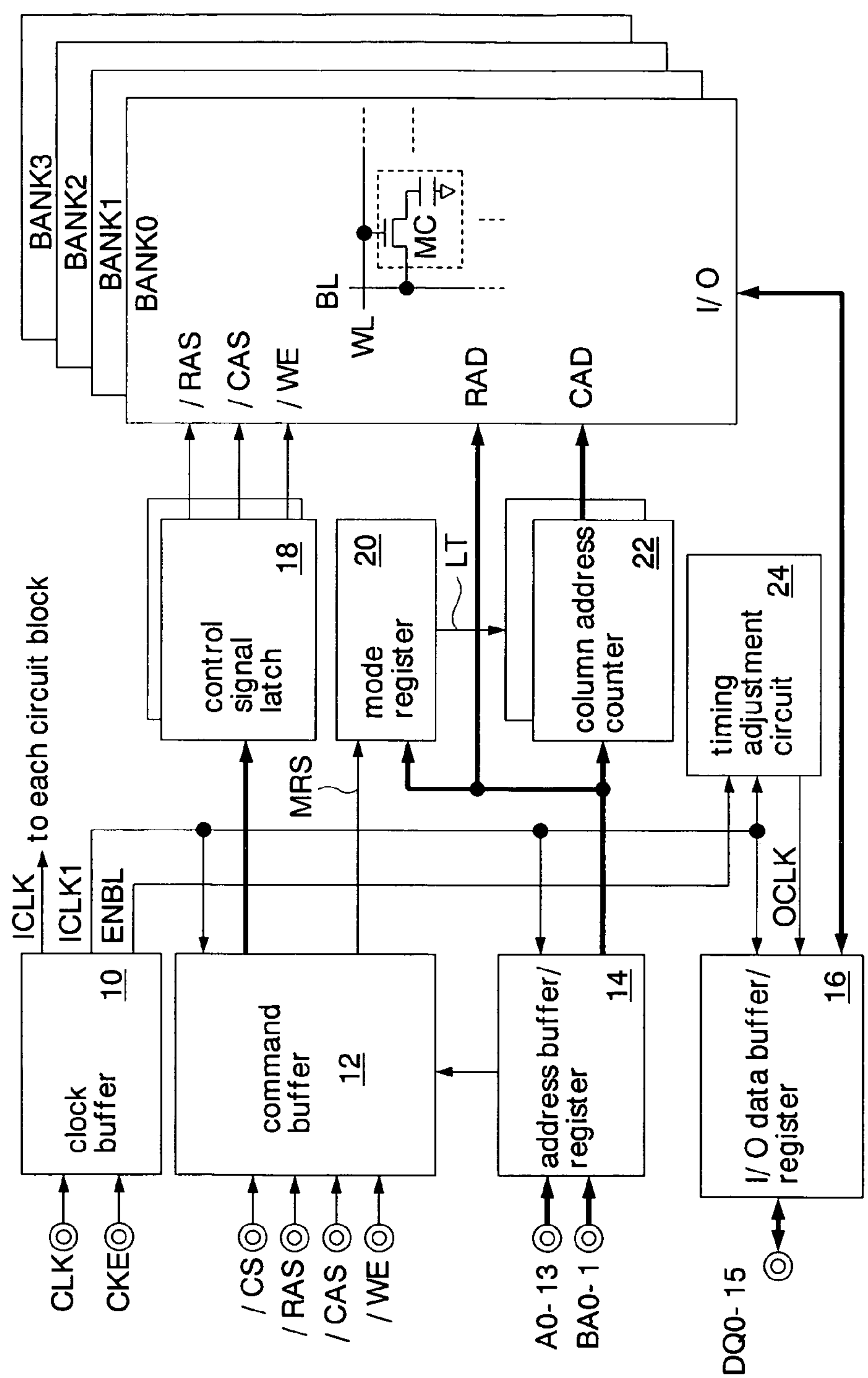
FIG. 1 is a block diagram showing a semiconductor integrated circuit according to a first embodiment of the present invention.

Now, embodiments of the present invention will be described with reference to the accompanying drawings. The double circles in the drawings indicate external terminals. A bold signal line in the drawings is made up of a plurality of lines. Additionally, part of a block connected with a bold line is made up of a plurality of circuits. A signal supplied via an external terminal is given the same symbol as that of the terminal name. A signal line along which a signal is transmitted is given the same symbol as that of the signal name. A signal ending in "Z" indicates positive logic. A signal starting with "/" or ending in "X" indicates negative logic.

FIG. 1 shows a semiconductor integrated circuit according to a first embodiment of the present invention. This semiconductor integrated circuit is formed on a silicon substrate through the CMOS process as a synchronous DRAM (hereinafter referred to as the SDRAM) of a clock synchronous type. The SDRAM includes a clock buffer 10, a command buffer 12, an address buffer/register 14, an I/O data buffer/register 16 (an internal circuit), a control signal latch 18, a mode register 20, a column address counter 22, a timing adjustment circuit 24, and banks BANK0 to BANK3 (memory cores).

While a clock enable signal CKE is enabled (at a high level), the clock buffer 10 receives an external clock signal CLK, which is then output as internal clock signals ICLK and ICLK1. The internal clock signal ICLK (a first timing signal) is supplied to a circuit which operates in synchronization with the clock. To receive an external signal in synchronization with the clock signal CLK, the internal clock signal ICLK1 is supplied to the command buffer 12, the address buffer/register 14, the I/O data buffer/register 16, and the timing adjustment circuit 24. The clock buffer 10 enables an enable signal ENBL in response to the clock enable signal CKE being enabled.

While a chip select signal /CS is enabled, the command buffer 12 receives a row address strobe signal /RAS, a column address strobe signal /CAS, and a write enable signal /WE in synchronization with the internal clock signal ICLK1, and then outputs the received signals to the control signal latch 18 as a control signal to operate the banks BANK0 to BANK3. When the signals /CS, /RAS, /CAS, and /WE are all at a low level, the command buffer 12 outputs a mode register setting signal MRS for setting the mode register 20.

The address buffer/register 14 receives address signals A0 to 13 in synchronization with the internal clock signal ICLK1, and then outputs the received signals as a row address signal RAD or a column address signal CAD. On the other hand, the address buffer/register 14 receives bank address signals BA0 to 1 in synchronization with the internal clock signal ICLK1. The bank address signals BA0 to 1 are used to select any one of the banks BANK0 to BANK3.

The I/O data buffer/register 16 includes a data input circuit for receiving data signals DQ0 to 15 (write data) in synchronization with the internal clock signal ICLK1 during write operations, and a data output circuit for outputting the data signals DQ0 to 15 (read data) in synchronization with an output clock signal OCLK during read operations. The control signal latch 18 latches control signals from the command buffer 12, and then outputs the signals to the banks BANK0 to BANK3 as the row address strobe signal /RAS, the column address strobe signal /CAS, and the write enable signal /WE.

The mode register 20 is set according to the address signals A0 to 12 that are supplied in synchronization with the mode register setting signal MRS. The mode register 20 sets CAS latency, burst lengths, and so on. The CAS latency indicates the number of clock cycles that are required from the reception of a read command to the output of read data. The CAS latency thus set is output to the column address counter 22 as a latency signal LT. The burst length indicates the number of data signals which are input or output in response to one write command or read command. The column address counter 22 receives a column address signal (a head address) from the address buffer/register 14, and then generates an address subsequent to the head address in accordance with the latency signal LT. The head address and the generated address are output as the column address signal CAD.

While the enable signal ENBL is enabled, the timing adjustment circuit 24 operates to generate the output clock signal OCLK that is synchronous with the internal clock signal ICLK. The timing adjustment circuit 24 will be detailed later with reference to FIGS. 2 to 12. The timing adjustment circuit 24 adjusts automatically the phase of the output clock signal OCLK depending on the threshold voltage of the transistors included in the SDRAM, the power supply voltage supplied to the SDRAM, and the operating temperature of the SDRAM. The phase of the output clock signal OCLK is more retarded at a lower threshold voltage, at a higher power supply voltage, or at a lower operating temperature.

At a lower threshold voltage, at a higher power supply voltage, or at a lower operating temperature, the internal circuit of the SDRAM operates at higher speeds, causing the transition edge timing of the internal clock signals ICLK and ICLK1 to be advanced (i.e., the phase is advanced). For this reason, when the I/O data buffer/register 16 outputs read data in synchronization with the internal clock signal ICLK, both the output start timing (tAC) and the output end timing (tOH) of the read data are advanced with respect to the external clock signal CLK. Under the aforementioned conditions, the present invention shifts the edge timing of the output clock OCLK toward a retarded side. Therefore, under the conditions that the internal circuit operates at high speeds, it is still possible to prevent the output timing of the read data from being offset with respect to the external clock signal CLK.

Each of the banks BANK0 to BANK3 includes a memory array having a plurality of volatile memory cells MC (dynamic memory cells) arranged in a matrix, and a control circuit (not shown) for access to the memory array (the control circuit including a word decoder, a column decoder, a sense amplifier, a pre-charge circuit, a sense buffer, and a write amplifier). The memory array has a plurality of word lines WL and a plurality of pairs of bit lines BL, which are connected to the memory cells MC. The memory cell MC includes a capacitor for sustaining data as electric charge, and a transfer transistor which is disposed between the capacitor and the bit line BL (or /BL). The gate of the transfer transistor is connected to the word line WL. The banks BANK0 to BANK3, which each have a control circuit for operating the memory array, are operable independent of each other.

Figure 2:
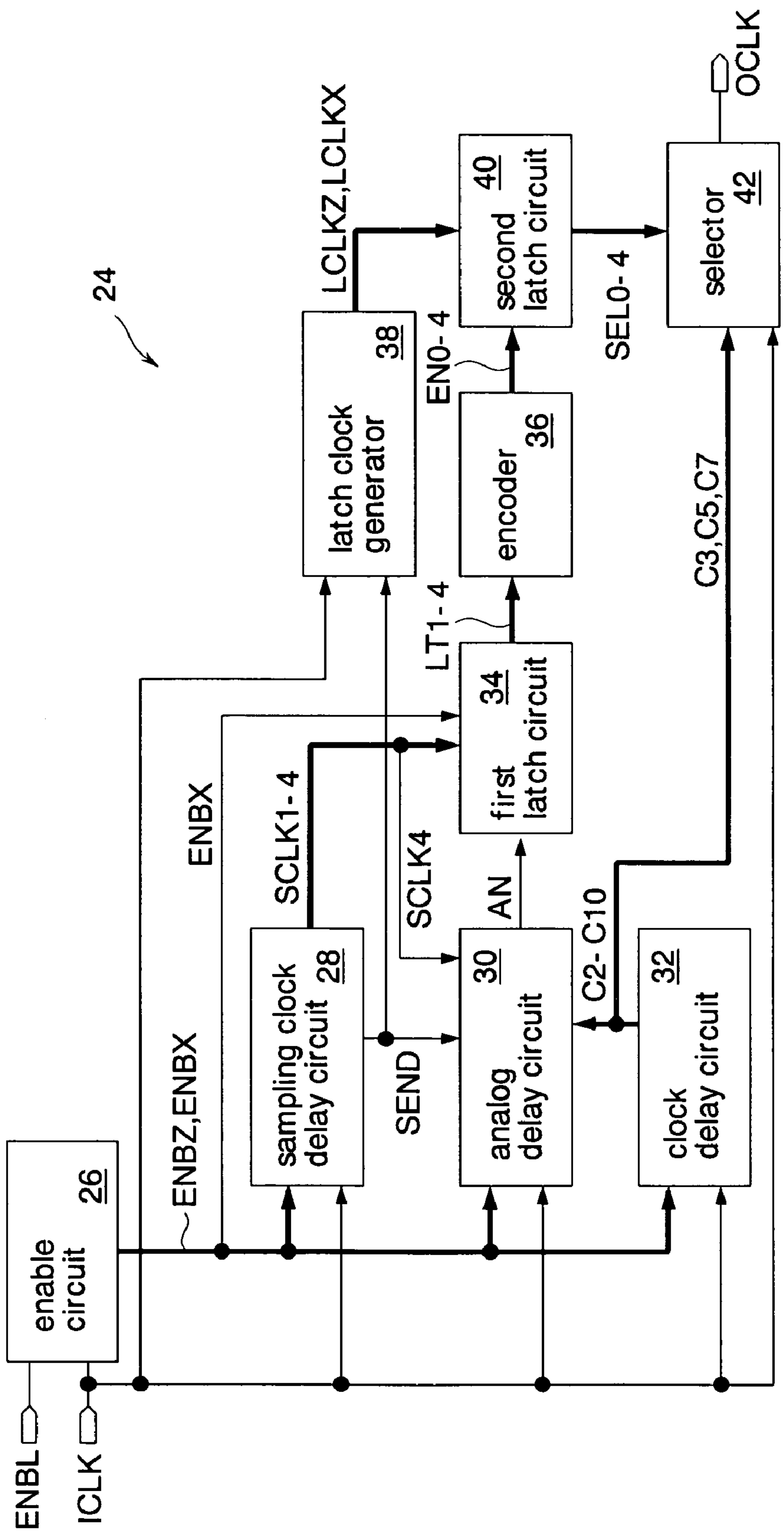
FIG. 2 is a detailed block diagram showing the timing adjustment circuit shown in FIG. 1.

FIG. 2 details the timing adjustment circuit 24 shown in FIG. 1. The timing adjustment circuit 24 includes an enable circuit 26, a sampling clock delaying circuit 28 (sampling signal delaying circuit), an analog delay circuit 30, a clock delay circuit 32 (timing signal delaying circuit), a first latch circuit 34, an encoder 36, a latch clock generator 38, a second latch circuit 40, and a selector 42.

The enable circuit 26 receives the enable signal ENBL in synchronization with the internal clock signal ICLK, and then outputs complementary enable signals ENBZ and ENBX.

The enable circuit 26 will be described in more detail with reference to FIG. 3. While the enable signals ENBZ and ENBX are enabled, the sampling clock delaying circuit 28 operates to generate sampling clock signals SCLK1 to 4 (sampling timing signals) which are obtained by sequentially delaying the internal clock signal ICLK, and a sampling end signal SEND. The sampling clock delaying circuit 28 will be described in more detail with reference to FIG. 5.

The analog delay circuit 30 pre-charges an analog node AN (first node) to a high level (power supply voltage) during the low level period of the internal clock signal ICLK and discharges the charge accumulated in the analog node AN according to the internal clock signal ICLK and delay clock signals C2 to C10 output from the clock delay circuit 32. The analog delay circuit 30 will be described in more detail with reference to FIG. 9. While the enable signal ENBZ is enabled, the clock delay circuit 32 operates to generate the delay clock signals C2 to C10 (delayed timing signals) which are obtained by sequentially delaying the internal clock signal ICLK. The clock delay circuit 32 will be described in more detail with reference to FIG. 7.

While the enable signal ENBX is enabled, the first latch circuit 34 operates to latch the voltage level at the analog node AN in synchronization with the sampling clock signals SCLK1 to 4, respectively, and then output the latched levels as latch signals LT1 to 4. The rising edges of the sampling clock signals SCLK1 to 4 that are shifted with respect to each other allow the logic of the latch signals LT1 to 4 to express the speed of discharging the analog node AN. More specifically, the slower the speed of discharging the analog node AN, the greater the number of the latch signals LT1 to 4 to be output at a high level. The first latch circuit 34 will be described in more detail with reference to FIG. 10.

The encoder 36 encodes the logic level of the latch signals LT1 to 4 and sets any one of encode signals EN0 to 4 to a high level. At the lowest speed of discharging the analog node AN, the encode signal EN0 is set to a high level. At the highest speed of discharging the analog node AN, the encode signal EN4 is set to a high level. The encoder 36 will be described in more detail with reference to FIG. 11.

The latch clock generator 38 is enabled during the low level period of the internal clock signal ICLK to generate latch clock signals LCLKZ and LCLKX synchronous with the sampling end signal SEND. The latch clock generator 38 will be described in more detail with reference to FIG. 12. The second latch circuit 40 latches the encode signals EN0 to 4 in synchronization with the latch clock signals LCLKZ and LCLKX and then outputs the latched signals as selection signals SEL0 to 4. The second latch circuit 40 will be described in more detail with reference to FIG. 11. The selector 42 outputs any one of the internal clock signal ICLK and the delay clock signals C3, C5, and C7 as the output clock signal OCLK depending on the selection signals SEL0 to 4. The selector 42 will be described in more detail with reference to FIG. 15.

Figure 3:
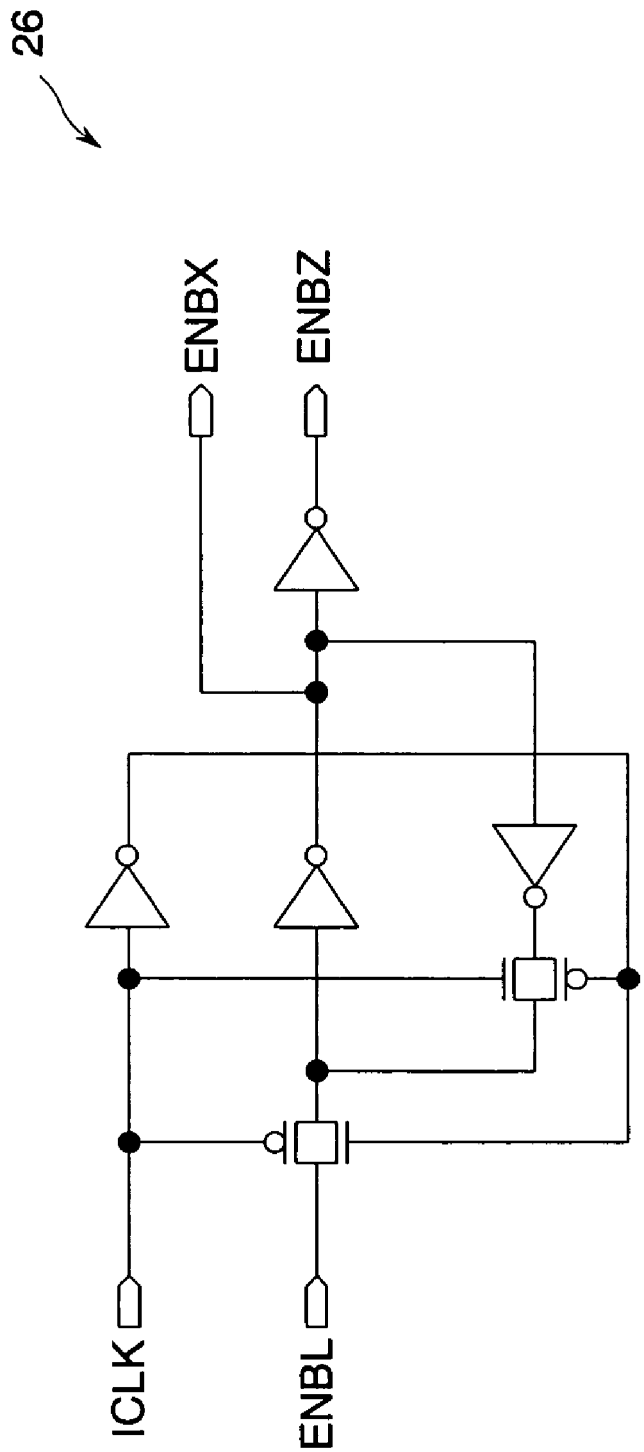
FIG. 3 is a detailed circuit diagram showing an enable circuit shown in FIG. 2.

FIG. 3 details the enable circuit 26 shown in FIG. 2. The enable circuit 26 has a CMOS transmission gate 26*a* which transmits the enable signal ENBL to the latch LT during the low level period of the internal clock signal ICLK. The latch LT includes a pair of inverters to form a feedback loop during the high level period of the internal clock signal ICLK. That is, the enable circuit 26 receives the enable signal ENBL during the low level period of the internal clock signal ICLK and then latches the enable signal ENBL in synchronization with the rising edge of the internal clock signal ICLK.

Figure 4:
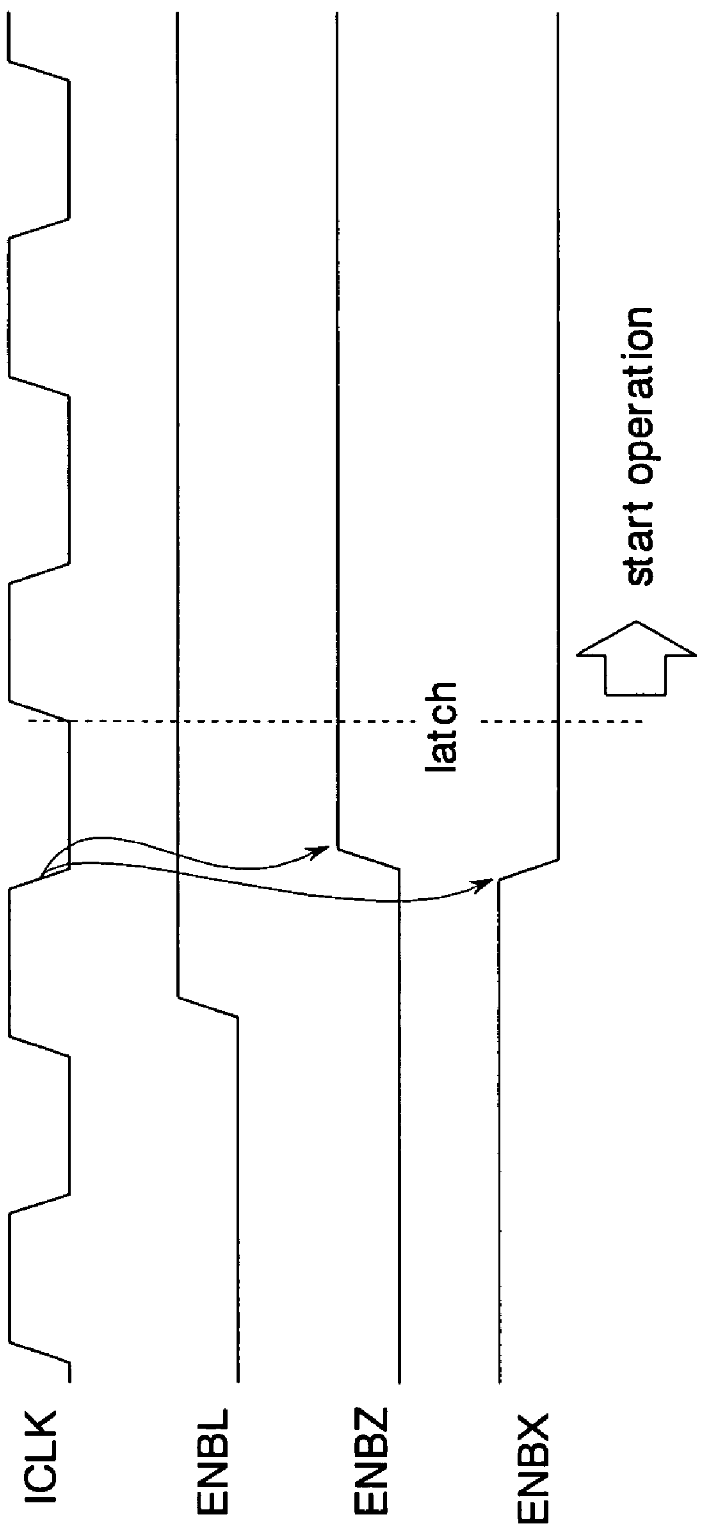
FIG. 4 is a timing diagram showing the operation of the enable circuit shown in FIG. 3.

FIG. 4 shows the operation of the enable circuit 26 shown in FIG. 3. As discussed with reference to FIG. 3, the enable circuit 26 receives the enable signal ENBL during the low level period of the internal clock signal ICLK to latch the enable signal ENBL in synchronization with the rising edge of the internal clock signal ICLK. That is, the enable circuit 26 starts the output of the enable signals ENBZ and ENBX during the high level period of the internal clock signal ICLK. As discussed later, the timing adjustment circuit 24 is enabled in synchronization with the enable signals ENBZ and ENBX being enabled and starts to operate in synchronization with the rising edge of the internal clock signal ICLK obtained by latching the high level enable signal ENBL.

Figure 5:
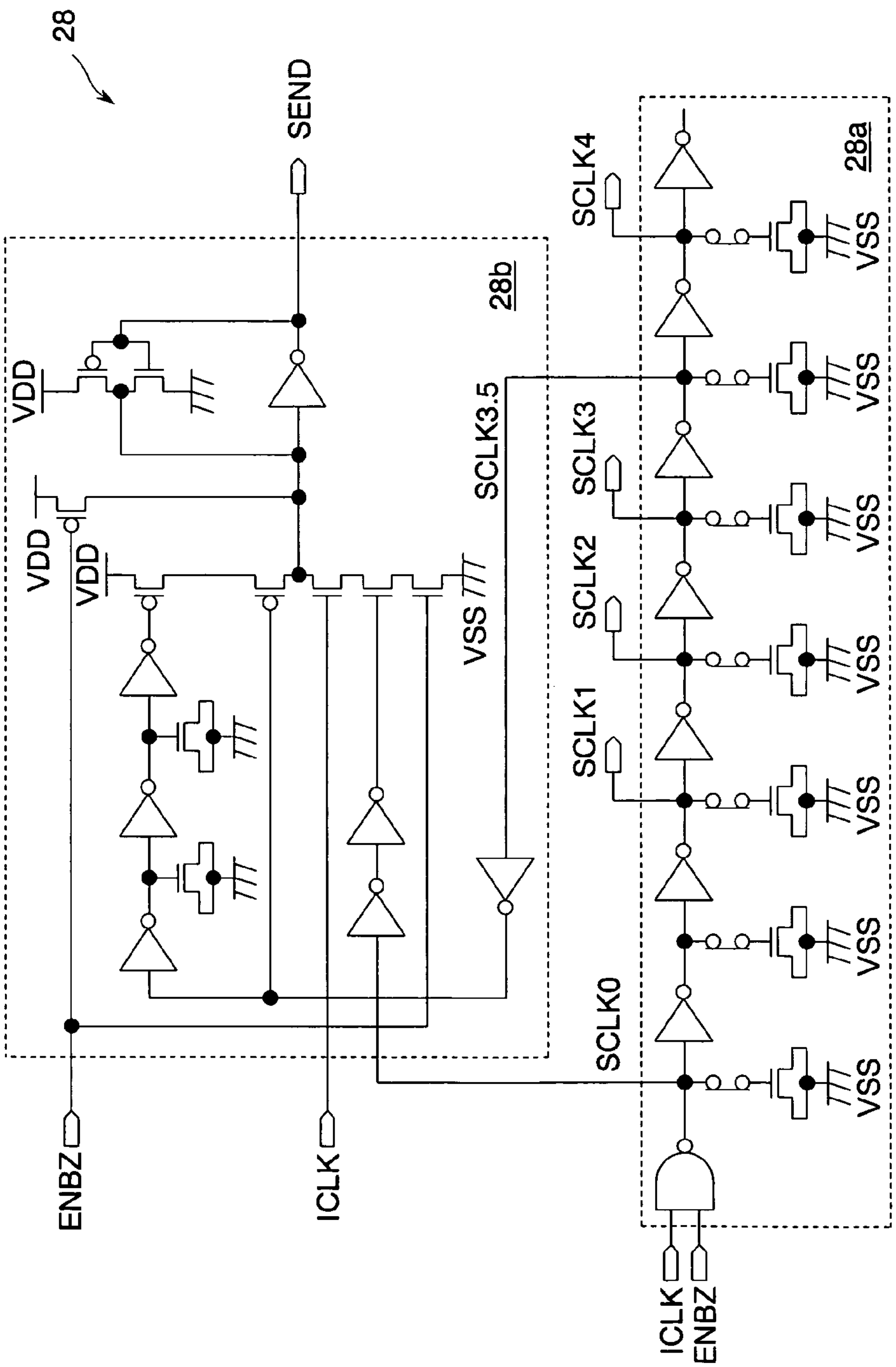
FIG. 5 is a detailed circuit diagram showing the sampling clock delaying circuit shown in FIG. 2.

FIG. 5 details the sampling clock delaying circuit 28 shown in FIG. 2. The sampling clock delaying circuit 28 has a sampling clock generating unit 28*a* and a sampling end clock generating unit 28*b*. The sampling clock generating unit 28*a* includes a NAND gate, a plurality of inverters connected in cascade to the output of the NAND gate, and a MOS capacitor connected to the input of each inverter. The NAND gate receives the internal clock signal ICLK and the enable signal ENBZ to output a sampling clock signal SCLK0. The second, third, fourth, and sixth inverter output the sampling clock signals SCLK1 to 4, respectively. The sampling clock signals SCLK0 to 4 are sequentially output in synchronization with the internal clock signal ICLK while the enable signal ENBZ is enabled. The MOS capacitor connects the gate to the input of the inverter via a switch, and the source and drain to a ground line VSS. It is possible to program the ON and OFF of the switch by means of a fuse, a metal conductor or the like.

The sampling end clock generating unit 28*b* includes an inverter with two pMOS transistors and three nMOS transistors connected in series between a power supply line VDD (a first power supply line) and a ground line VSS (a second power supply line). Also included are a PMOS transistor for pre-charging the output node of the inverter and a latch connected to the output node of the inverter. The sampling end clock generating unit 28*b* stops operating while the enable signal ENBZ is disabled. This operation makes it possible to reduce the power consumption of the SDRAM during its disabled state in which the enable signal ENBZ is disabled. The sampling end signal SEND is initialized to a high level when the pre-charging pMOS transistor is turned on. The sampling clock generating unit 28*a* starts operating in response to the enable signal ENBZ being enabled and generates the sampling clock signals SCLK0 to 4 while receiving the high level enable signal ENBZ. The sampling end signal SEND changes into a low level in synchronization with the rising edge of a sampling clock signal SCLK3.5 which is obtained by delaying the rising edge of the internal clock signal ICLK, or changes into a high level in synchronization with the rising edge of the internal clock signal ICLK.

Figure 6:
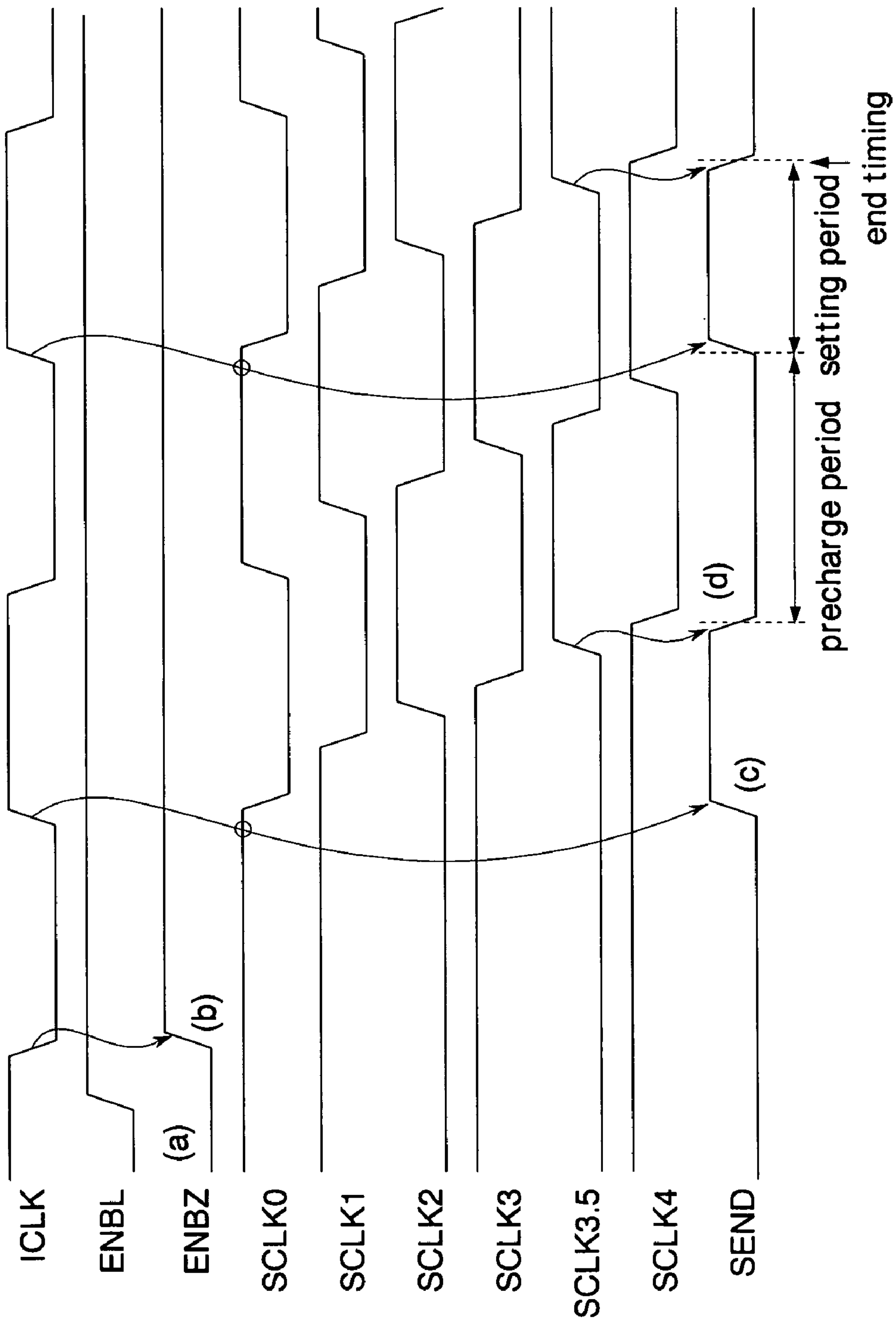
FIG. 6 is a timing diagram showing the operation of the sampling clock delaying circuit shown in FIG. 5.

FIG. 6 shows the operation of the sampling clock delaying circuit 28 shown in FIG. 5. While the enable signal ENBL is disabled, the enable signal ENBZ is disabled (FIG. 6(*a*)). The sampling clock signals SCLK2 and 3.5 and the sampling end signal SEND are sustained at a low level, while the sampling clock signal SCLK0, 1, 3, and 4 are held at a high level. After the enable signal ENBL has been enabled, the enable signal ENBZ being enabled in synchronization with the falling edge of the internal clock signal ICLK causes the sampling clock generating unit 28*a* to start operating (FIG. 6(*b*)). Thereafter, the logic levels of the sampling clock signals SCLK0 to 4 are sequentially inverted in synchronization with the transition edge of the internal clock signal ICLK.

The three serially connected nMOS transistors in the inverter of the sampling end clock generating unit 28*b* are all turned on during the overlapping periods of the high level of the internal clock signal ICLK and the high level of the sampling clock signal SCLK0. By the nMOS transistors being turned on, the sampling end signal SEND changes into a high level (FIG. 6(*c*)). The two serially connected pMOS transistors in the inverter of the sampling end clock generating unit 28*b* are turned on during a predetermined period in synchronization with the rising edge of the sampling clock signal SCLK3.5. By the pMOS transistors being turned on, the sampling end signal SEND changes into a low level (FIG. 6(*d*)).

Subsequently, the sampling end signal SEND changes into a high level in synchronization with the rising edge of the internal clock signal ICLK, or changes into a low level in synchronization with the rising edge of the sampling clock signal SCLK3.5. As discussed later, the low level period of the sampling end signal SEND is a period (initializing period) during which the analog node AN is pre-charged. The high level period of the sampling end signal SEND is a setting period (measurement period) during which the output timing of the output clock signal OCLK (delay time) is determined. The falling edge of the sampling end signal SEND is the end timing of the setting period.

Figure 7:
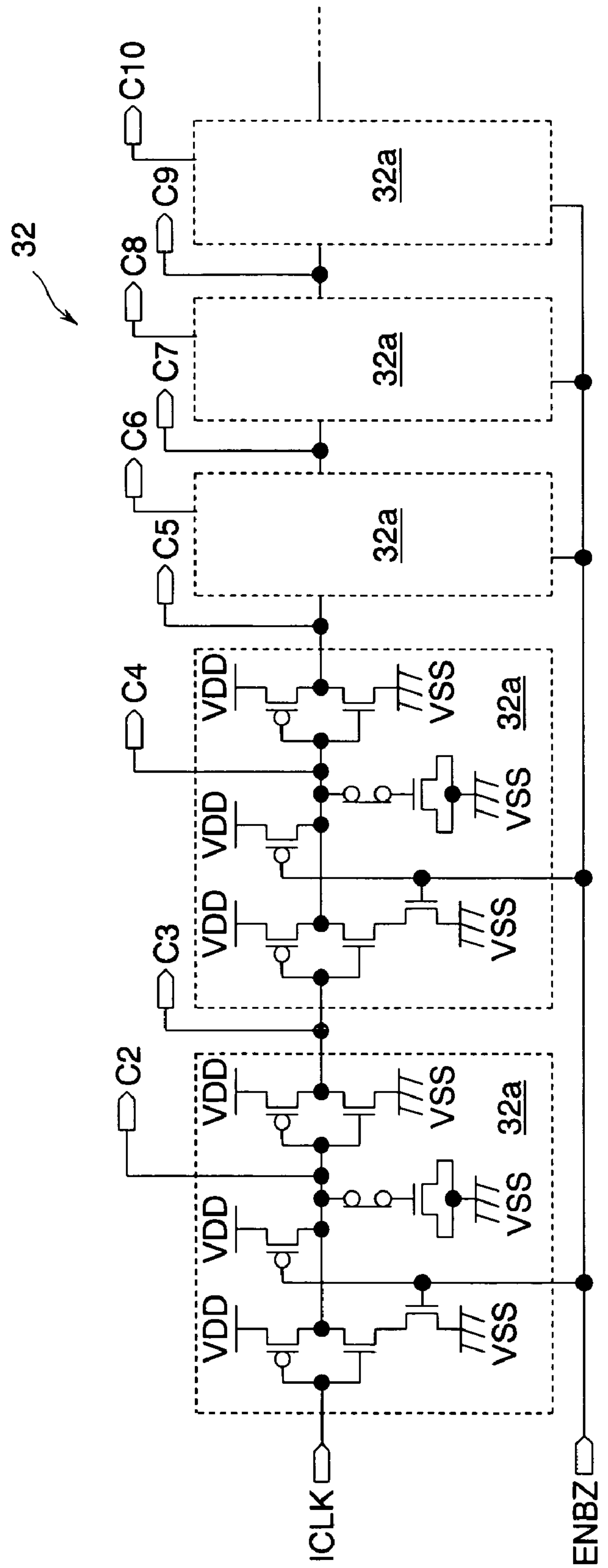
FIG. 7 is a detailed circuit diagram showing the clock delay circuit shown in FIG. 2.

FIG. 7 details the clock delay circuit 32 shown in FIG. 2. The clock delay circuit 32 includes a plurality of cascade connected delay stages 32*a*. Each of the delay stages 32*a* includes a NAND gate and an inverter arranged via a cascade connection, and a MOS capacitor connected to the input of the inverter. The MOS capacitor connects the gate to the input of the inverter via a switch, with the source and drain connected to the ground line VSS. It is possible to program the on and off of the switch by means of a fuse, a metal conductor or the like. One input of the NAND gate receives the internal clock signal ICLK or the output from the preceding stage. The other input of the NAND gate receives the enable signal ENBZ. The delay stages 32*a* allow the NAND gate to output the delay clock signal C2 (C4, C6, C8, or C10), and the inverter to output the delay clock signal C3 (C5, C7, or C9). That is, the clock delay circuit 32 generates the delay clock signals C2 to C10 which are obtained by sequentially inverting the internal clock signal ICLK (first timing signal) received at the first stage. The clock delay circuit 32 generates the delay clock signals C2 to C10 only while receiving the high level enable signal ENBZ. This operation makes it possible to reduce the power consumption of the SDRAM during its disabled state in which the enable signal ENBZ is disabled.

Figure 8:
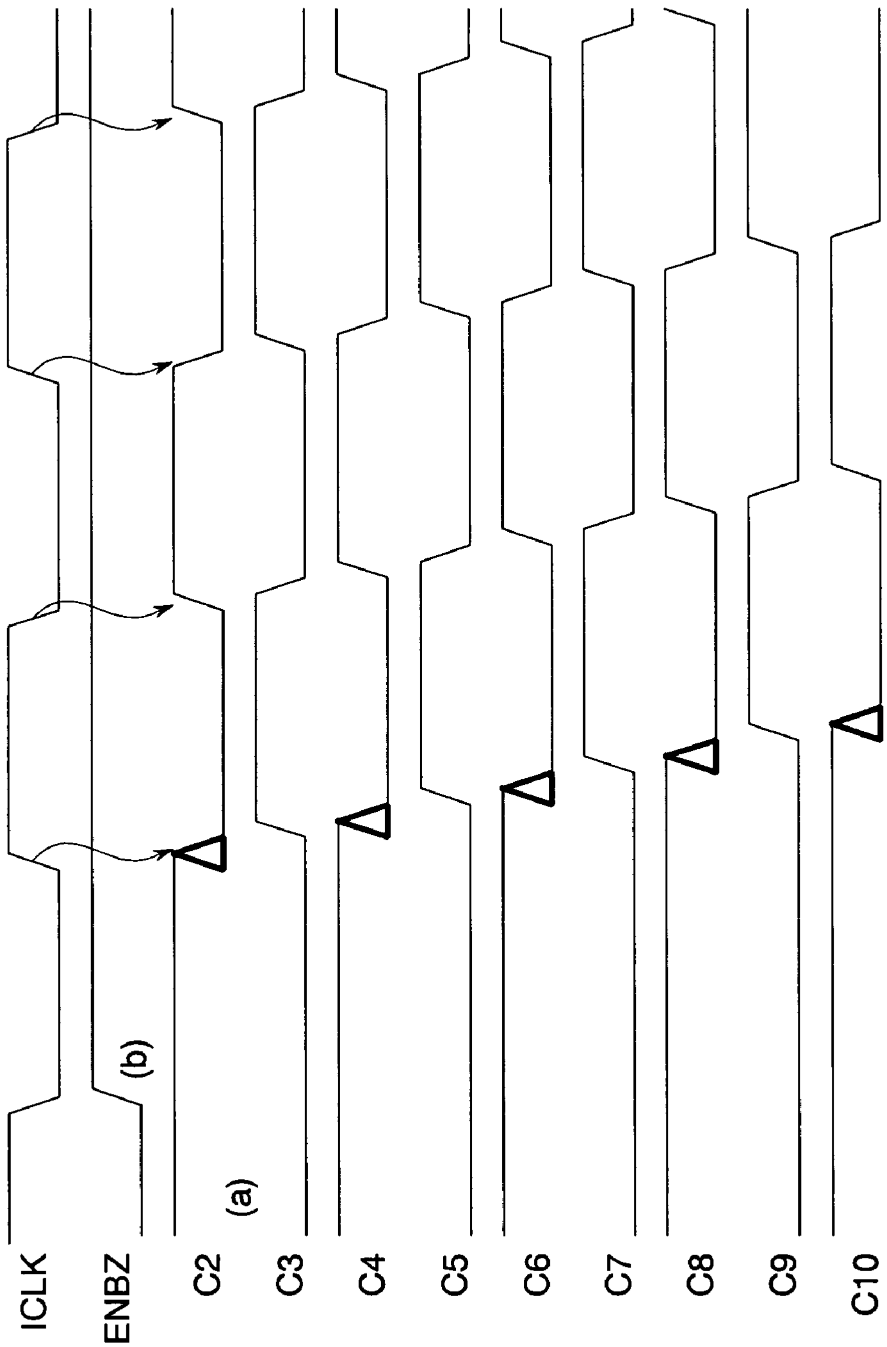
FIG. 8 is a timing diagram showing the operation of a clock delay circuit 32 shown in FIG. 7.

FIG. 8 illustrates the operation of the clock delay circuit 32 shown in FIG. 7. While the enable signal ENBZ is disabled, the delay clock signals C2, C4, C6, C8, and C10 are sustained at a high level, whereas the delay clock signals C3, C5, C7, and C9 are sustained at a low level (FIG. 8(*a*)). The enable signal ENBZ being enabled in synchronization with the falling edge of the internal clock signal ICLK causes the clock delay circuit 32 to start operating (FIG. 8(*b*)). The delay clock signals C2 to C10 are inverted sequentially in synchronization with the transition edge of the internal clock signal ICLK. The high level period of the internal clock signal ICLK and the delay clock signal C2, and the high level periods of the delay clock signals C3 and 4, C5 and 6, C7 and 8, and C9 and 10, each indicated by a triangular symbol in the figure, represent the period for discharging the analog node AN (FIG. 2) which has been pre-charged to the power supply voltage VDD (the first power supply voltage). The operation of discharging the analog node AN will be discussed later with reference to FIGS. 16 to 18.

Figure 9:
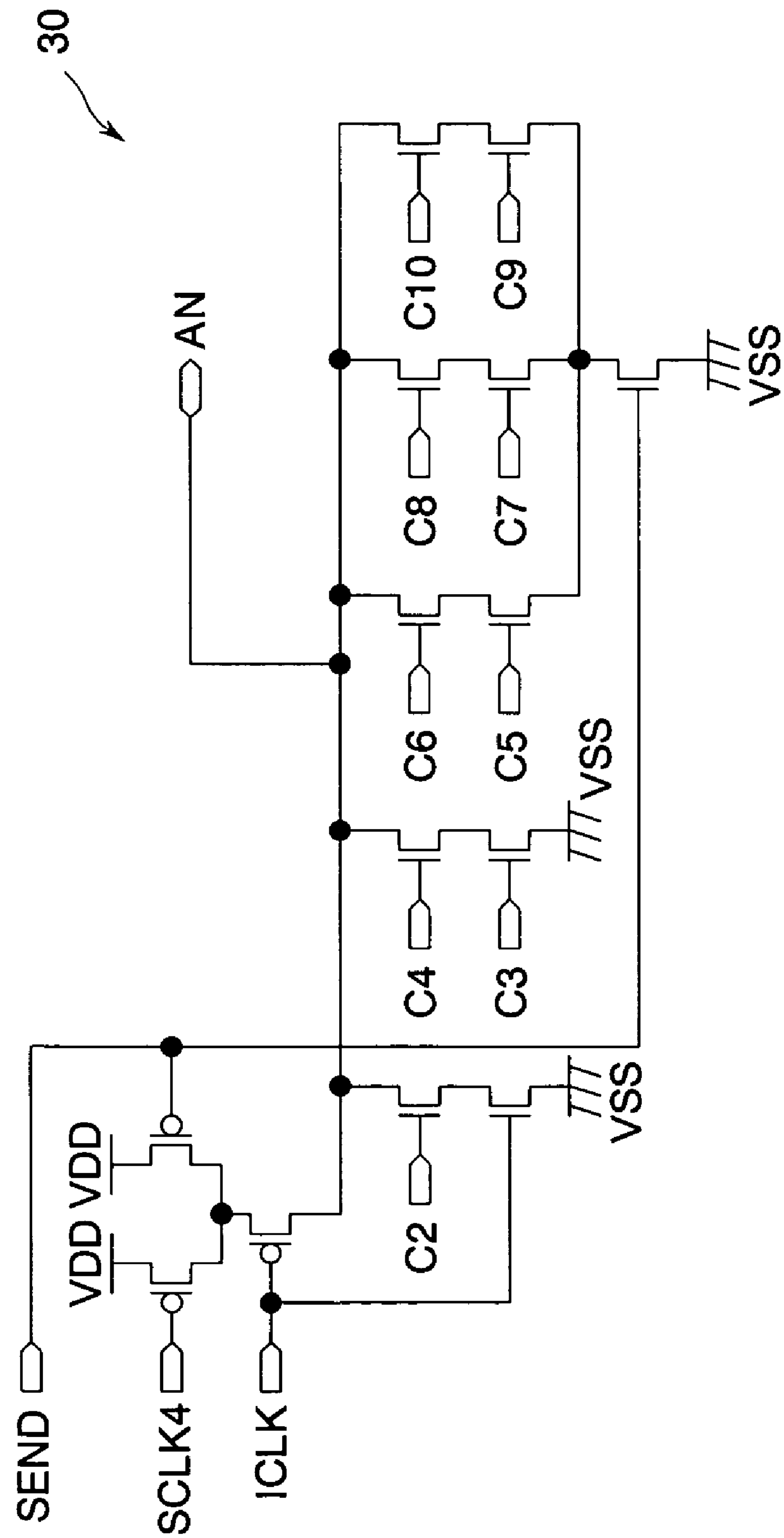
FIG. 9 is a detailed circuit diagram showing an analog delay circuit 30 shown in FIG. 2.

FIG. 9 details the analog delay circuit 30 shown in FIG. 2. The analog delay circuit 30 includes a plurality of pMOS transistors (first transistors) for pre-charging the analog node AN (the first node), and a plurality of pairs of nMOS transistors (pairs of second transistors) for discharging the analog node AN. Each pair of nMOS transistors is disposed in series between the analog node AN and the ground line VSS. A pair of nMOS transistors receives one or the other of a pair of delay clock signals C3 and 4 (C5 and 6, C7 and 8, or C9 and 10) whose rising edge and falling edge are adjacent to each other. In other words, each pair of nMOS transistors receives the delay clock signal C2 to C10 which have been generated by sequentially delaying the internal clock signal ICLK. On the other hand, the pair of nMOS transistors receives a pair of delay clock signals which are different from each other.

The analog node AN is pre-charged during the period (the pre-charge period) in which all the sampling end signal SEND, the internal clock signal ICLK, and the sampling clock signal SCLK4 are at a low level. The analog node AN is discharged during the high level period of the internal clock signal ICLK and the delay clock signal C2, and the high level periods of the delay clock signals C3 and 4, C5 and 6, C7 and 8, and C9 and 10.

Figure 10:
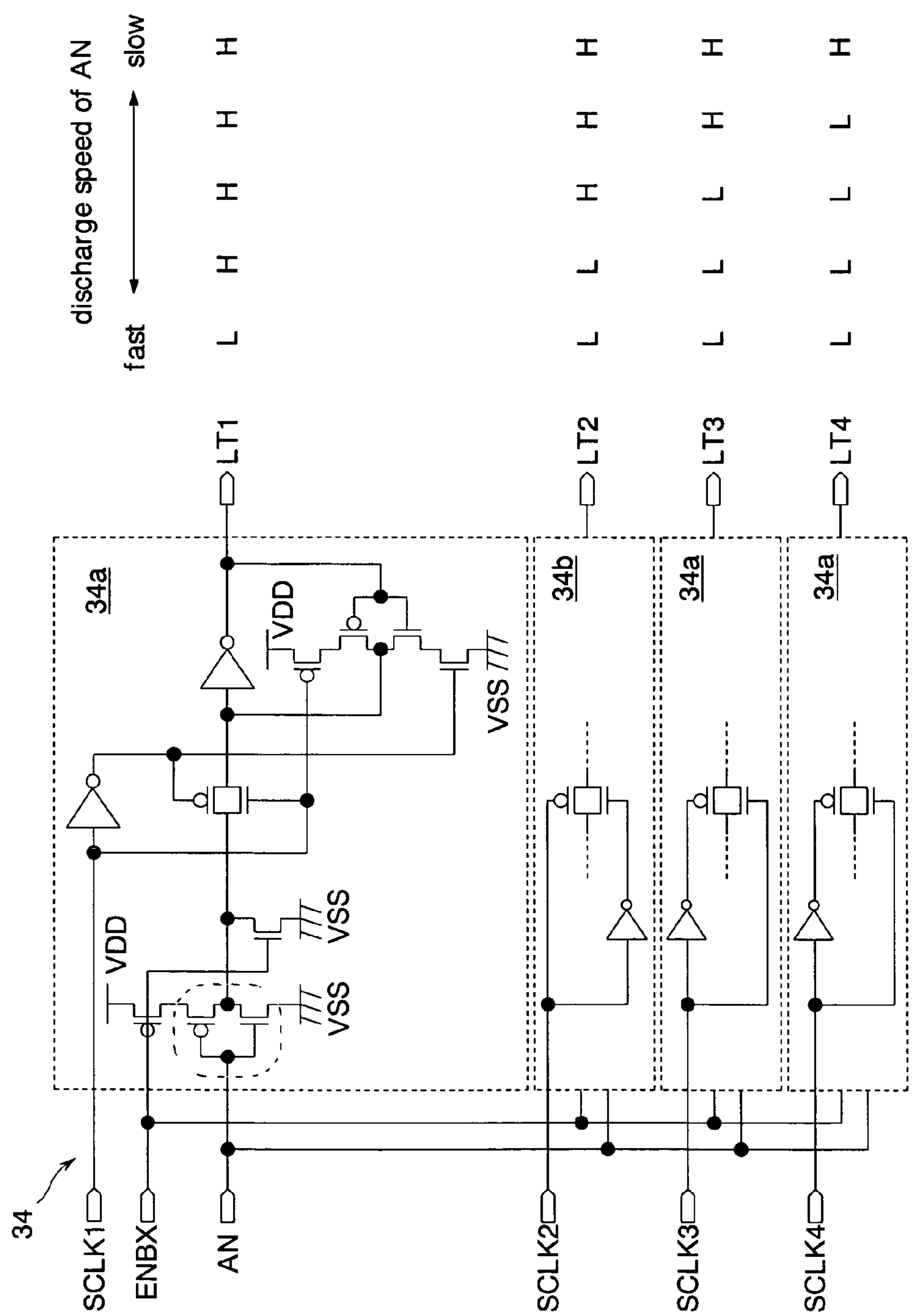
FIG. 10 is a detailed circuit diagram showing a first latch circuit 34 shown in FIG. 2.

FIG. 10 details the first latch circuit 34 shown in FIG. 2. The first latch circuit 34 includes two types of latch units 34*a* and 34*b* (detection circuits). The latch units 34*a* and 34*b* are each configured to include a NOR gate for receiving the enable signal ENBX and the voltage level at the analog node AN, a CMOS transmission gate, and a latch in a serial connection. The latch units 34*a* and 34*b* are the same except that they have different logic levels of the sampling clock signal SCLK for operating the CMOS transmission gate and the latch. In other words, the latch unit 34*a* performs latch operations in accordance with the sampling clock signals SCLK1, 3, or 4 whose phases are opposite to the internal clock signal ICLK. The latch unit 34*b* performs latch operations in accordance with the sampling clock signal SCLK2 which is in phase with the internal clock signal ICLK.

The NOR gate detects the voltage at the analog node AN as a logic value. In the NOR gate, the transistors (encircled by a dotted line) whose gates are connected to the analog node AN and whose drains output a voltage corresponding to the logic value has a threshold voltage (absolute value) set to be lower than that of other transistors. This holds true in the latch units 34*a* and 34*b* corresponding to the sampling clock signals SCLK2 to 4. This allows each of the latch units 34*a* and 34*b* to reduce the time required for detecting a change in voltage at the analog node AN, thereby reducing the dead zone of the NOR gate (in which the output is not at a high level nor low level). The NOR gate operates only while receiving the low level enable signal ENBX, thereby preventing leakage current from flowing during a standby state even at a low threshold voltage of the aforementioned transistors.

The latch units 34*a* and 34*b* latch the level of the analog node AN sequentially in synchronization with the transition edge of the sampling clock signals SCLK1 to 4 corresponding to the rising edge of the internal clock signal ICLK, and outputs the latched levels as the latch signals LT1 to 4. For this reason, the higher the speed of discharging the analog node AN, the greater the number of the low level (L) latch signals LT becomes. Thus, the lower the speed of discharging the analog node AN, the less the number of the L level latch signals LT becomes. The latch signals LT1 to 4 change to a high level (H) in the ascending order of the subscripts of the signals.

Figure 11:
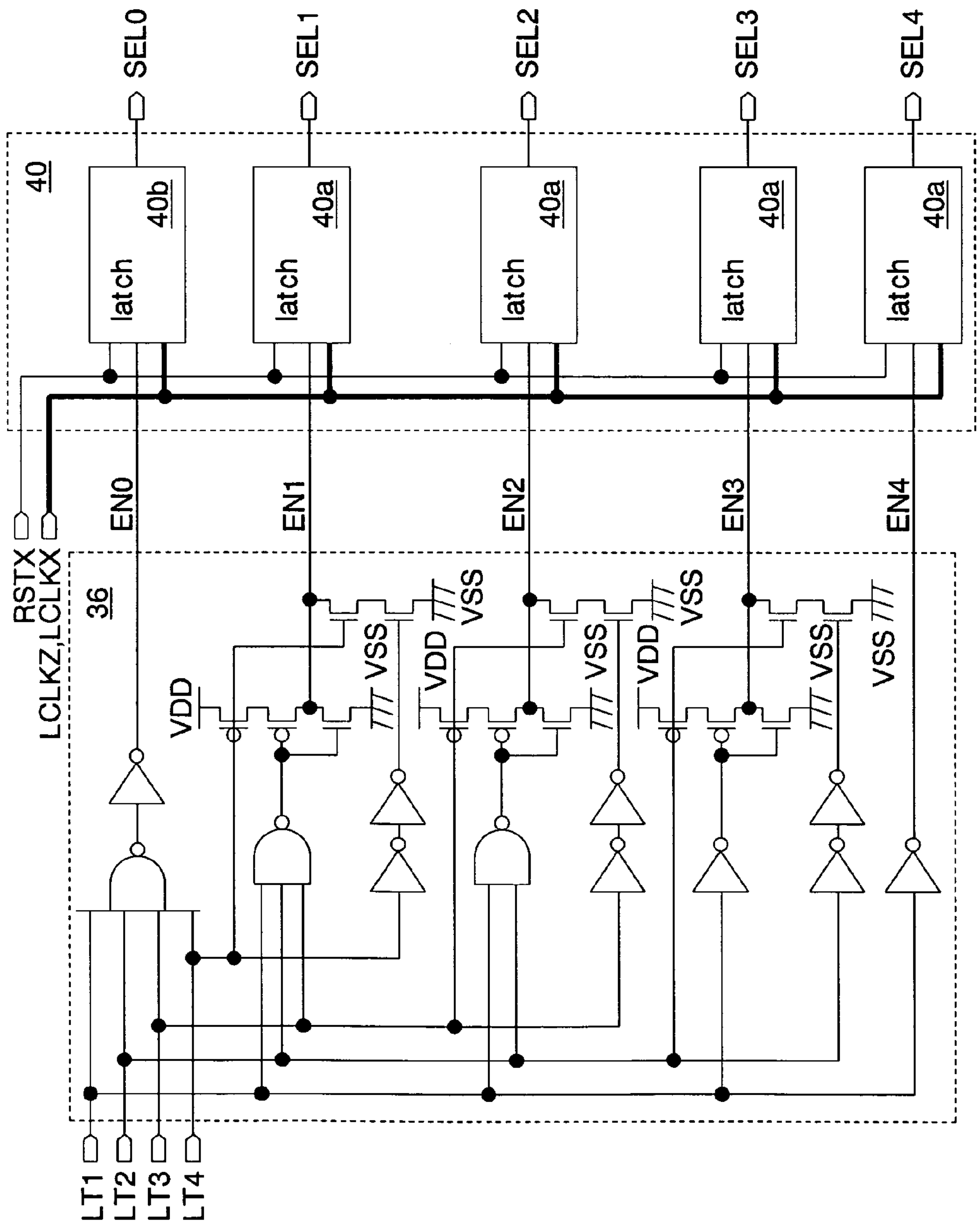
FIG. 11 is a detailed circuit diagram showing an encoder 36 and a second latch circuit 40 shown in FIG. 2.

FIG. 11 details the encoder 36 and the second latch circuit 40, which have been shown in FIG. 2. The encoder 36 encodes the logic levels of the latch signals LT1 to 4 to generate the encode signals EN0 to 4. For example, at the lowest speed of discharging the analog node AN, i.e., at the high level of all the latch signals LT1 to 4, only the encode signal EN0 is sustained at the high level whereas the other encode signals EN1 to 4 change to a low level. On the other hand, at the highest speed of discharging the analog node AN, i.e., at the low level of all the latch signals LT1 to 4, only the encode signal EN4 is sustained at a high level whereas the other encode signals EN0 to 3 change to a low level.

The encoder 36 is disposed between the output node of the encode signals EN 1 to 4 and the ground line VSS, and has a pair of nMOS transistors. The gates of the pair of nMOS transistors receive the latch signal LT4 (LT3 or 2) and the delayed signal (through two stages of inverters), respectively. The two stages of inverters operate as a disable timing delaying circuit which delays the disable timing of an enabled encode signal relative to the enable timing of a newly enabled encode signal. For example, when the logic level of the latch signals LT1 to 4 is at "HHHL", the logic level of the encode signals EN0 to 5 is at "LHLLL". When the logic level of the latch signals LT1 to 4 changes from "HHHL" to "HHHH", the two stages of inverters receiving the latch signal LT4 cause the timing at which the encode signal EN1 changes to a low level to be delayed relative to the timing at which the encode signal EN0 changes to a high level. Accordingly, it is possible to prevent all the encode signals EN0 to 4 from changing to a low level. As a result, it is possible to prevent all the selection signals SEL0 to 4 from changing to a low level, thus eliminating the drawback of the selector 42 being incapable of outputting the output clock signal OCLK.

Figure 13:
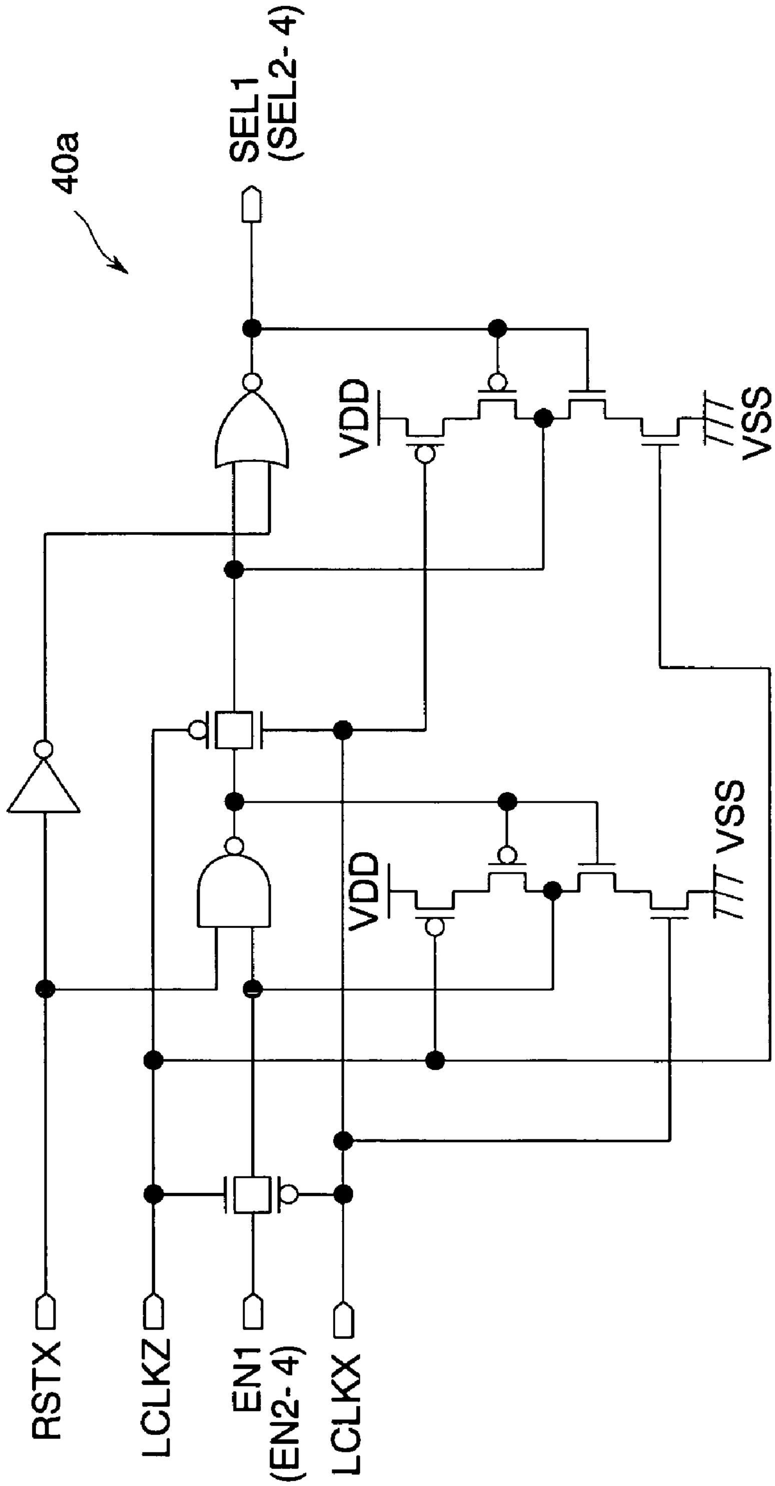
FIG. 13 is a detailed circuit diagram showing a latch 40*a* shown in FIG. 11.
Figure 14:
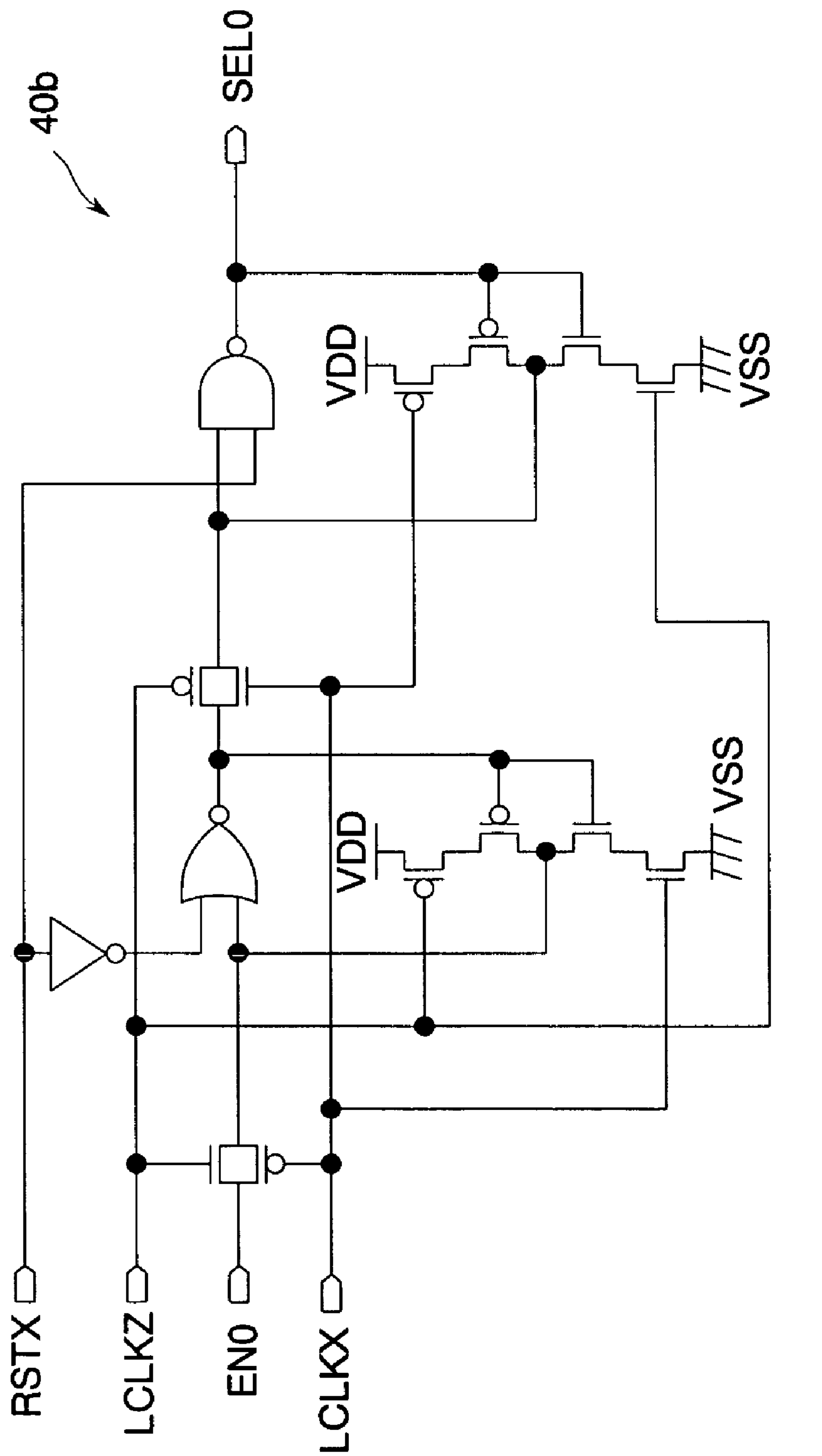
FIG. 14 is a detailed circuit diagram showing a latch 40*b* shown in FIG. 11.

The second latch circuit 40 includes latches 40*a* and 40*b* corresponding to the encode signals EN0 and 1 to 4. The latches 40*a* and 40*b* latch the encode signals EN0 to 4 in synchronization with the latch clock signals LCLKZ and LCLKX, and then outputs the latched signals as the selection signals SEL0 to 4. For example, at the lowest speed of discharging the analog node AN, only the selection signal SEL0 is set to a high level, whereas the other selection signals SEL1 to 4 are set to a low level. On the other hand, at the highest speed of discharging the analog node AN, only the selection signal SEL4 is set to a high level, whereas the other selection signals SEL0 to 3 are set to a low level. As shown in FIG. 13, discussed later, when reset, the latch 40*a* outputs the low level selection signals SEL1 to 4. On the other hand, as shown in FIG. 14, discussed later, when reset, the latch 40*b* outputs the high level selection signal SEL0. In the initial state, this causes the selection signal SEL0 to be valid.

Figure 12:
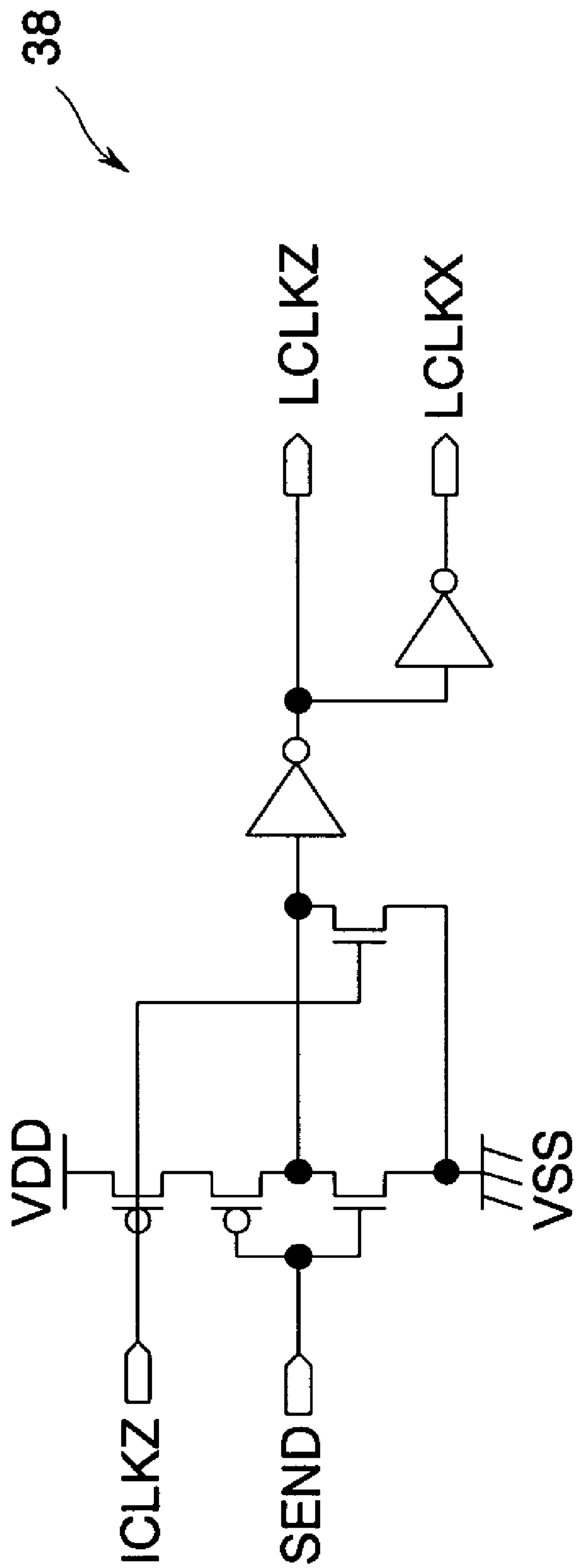
FIG. 12 is a detailed circuit diagram showing a latch clock generator 38 shown in FIG. 2.

FIG. 12 details the latch clock generator 38 shown in FIG. 2. The latch clock generator 38 includes a NOR gate for receiving the internal clock signal ICLK and the sampling end signal SEND, and an inverter, the NOR gate and the inverter being connected in series. The latch clock generator 38 changes the latch clock signals LCLKZ and LCLKX to a low and high level while both the internal clock signal ICLK and the sampling end signal SEND are at a low level. The latches 40*a* and 40*b* shown in FIG. 11 latch the encode signals EN0 to 4 in synchronization with the latch clock signal LCLKZ being changed from the high level to the low level.

FIG. 13 details the latch 40*a* shown in FIG. 11. The latch 40*a* has a CMOS transmission gate, a latch, a CMOS transmission gate, and a latch connected in series. The latch in the first stage includes a NAND gate and a clocked inverter. The latch in the second stage includes a NOR gate and a clocked inverter. The CMOS transmission gate in the first stage transmits an enable signal EN (one of the EN1 to 4) to the NAND gate during the high level period of the latch clock signal LCLKZ. The latch having the NAND gate latches the enable signal EN in synchronization with the falling edge of the latch clock signal LCLKZ.

The CMOS transmission gate in the second stage transmits the enable signal EN latched during the low level period of the latch clock signal LCLKZ to the NOR gate. The latch having the NOR gate transmits the enable signal EN to the NOR gate in synchronization with the falling edge of the latch clock signal LCLKZ and latches the same, and then outputs the latched signal as a selection signal SEL. The latch 40*a* is initialized by a reset signal RSTX, and sets the selection signal SEL (one of the signals SEL1 to 4) to a low level.

FIG. 14 details the latch 40*b* shown in FIG. 11. The latch 40*b* has a CMOS transmission gate, a latch, a CMOS transmission gate, and a latch connected in series. The latch in the first stage includes a NOR gate and a clocked inverter. The latch in the second stage includes a NAND gate and a clocked inverter. The latch 40*b* operates in the same manner as the latch 40*a* shown in FIG. 13 except that the latch 40*b* outputs a high level selection signal SEL0 when reset.

Figure 15:
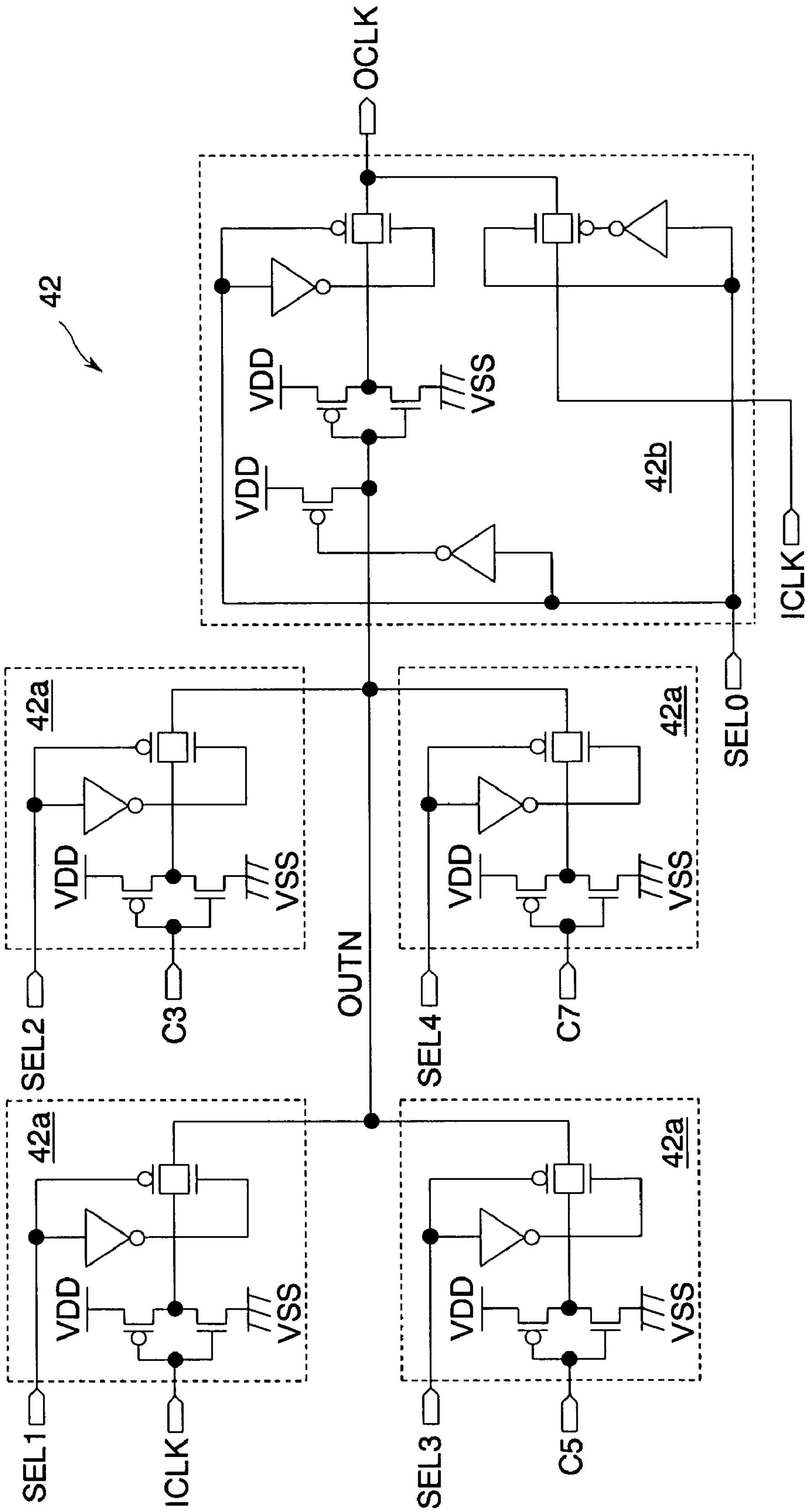
FIG. 15 is a detailed circuit diagram showing a selector 42 shown in FIG. 2.

FIG. 15 details the selector 42 shown in FIG. 2. The selector 42 has four selection circuits 42*a* and a selection circuit 42*b*. When having received the high level selection signal SEL1 (or SEL2 to 4), each of the selection circuits 42*a* transmits to an output node OUTN a signal which has been obtained by inverting the internal clock signal ICLK (or the delay clock signal C3, C5, or C7, or a second timing signal). The selection circuit 42*b* outputs an inverted version of the signal, which has been transmitted to the output node OUTN, or the internal clock signal ICLK as the output clock signal OCLK (the second timing signal) according to the selection signal SEL0.

When having received each of the high level selection signals SEL0 to 4, the selector 42 outputs the internal clock signal ICLK, a signal obtained by delaying the internal clock signal ICLK through the two stages of inverters, and a signal obtained by delaying the delay clock signal C3, C5, or C7 through the two stages of inverters, as the output clock signal OCLK.

Figure 16:
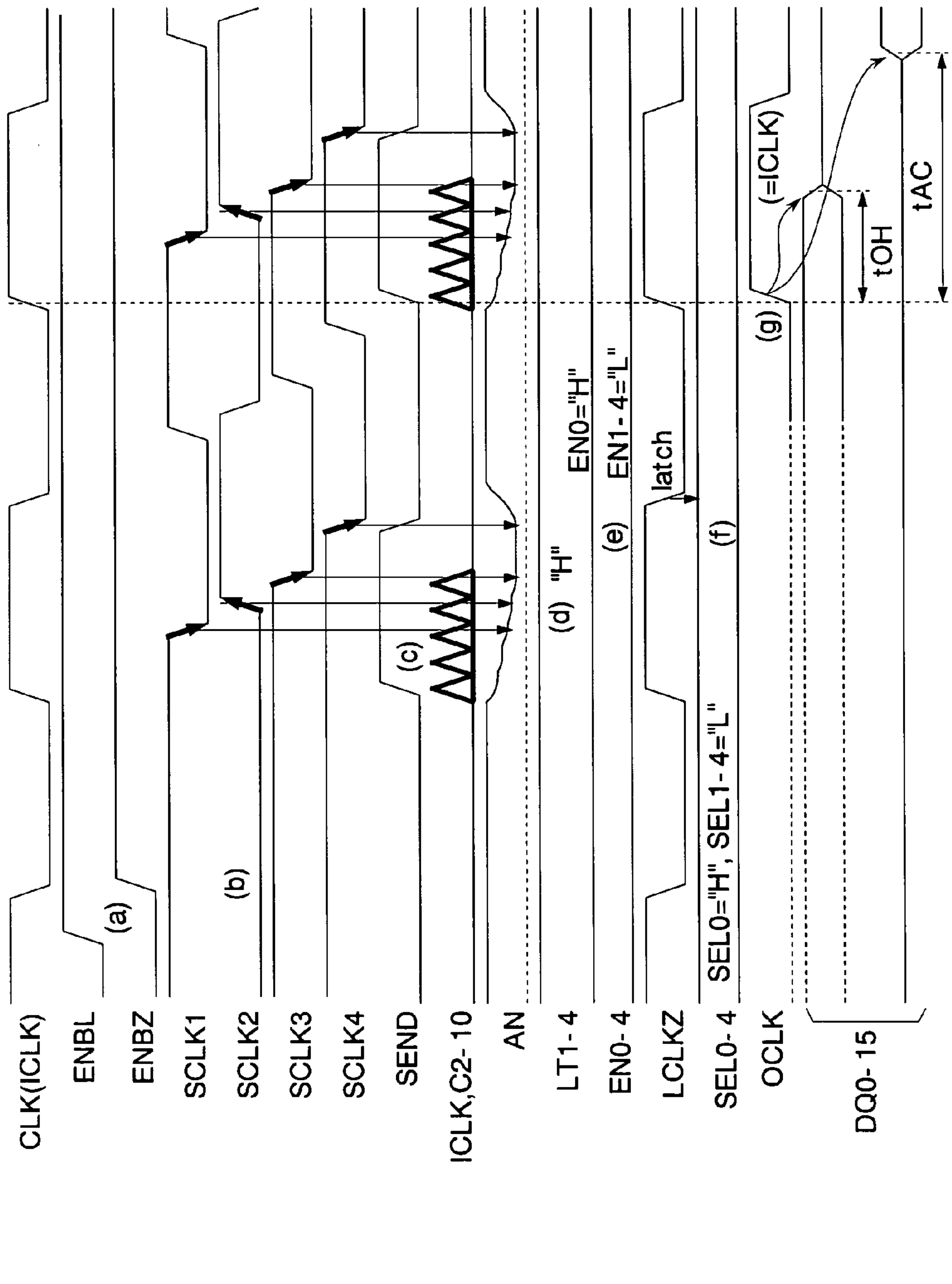
FIG. 16 is a timing diagram showing an exemplary operation of an SDRAM according to the first embodiment.

FIG. 16 shows an example of operation of the SDRAM according to the first embodiment. In this example, the transistors of the SDRAM have a high threshold voltage (absolute value), while the control circuits such as the clock buffer 10 and the control signal latch 18 have a low operating speed.

First, as shown in FIG. 4, the enable signal ENBL is enabled, and the enable signal ENBZ is enabled in synchronization with the falling edge of the clock signal CLK (FIG. 16(*a*)). When enabled, the enable signal ENBZ causes the sampling clock signals SCLK1 to 4 and the sampling end signal SEND to be sequentially generated (FIG. 16(*b*)). The delay clock signals C2 to 10 are also created sequentially during the high level period (first level period) of the internal clock signal ICLK (FIG. 16(*c*)). As in FIG. 8, the triangular symbols in FIG. 16 indicate both the high level periods of two delay clock signals (e.g., C3 and C4), during which discharged is the analog node AN (FIG. 9) that has been pre-charged to the power supply voltage VDD.

During the high level period of the internal clock signal ICLK and the delay clock signal C2 and the high level periods of the delay clock signals C3 and 4, C5 and 6, C7 and 8, and C9 and 10, the charges at the analog node AN are gradually discharged, causing the voltage at the analog node AN to be gradually reduced. A high transistor threshold voltage (absolute value), a low power supply voltage, or a high SDRAM operating temperature will permit a less amount of transistor current to flow, causing the voltage at the analog node AN to be lowered more slowly. The first latch circuit 34 shown in FIG. 10 latches sequentially the logic level corresponding to the voltage at the analog node AN in synchronization with the sampling clock signals SCLK1 to 4. A low speed at which the voltage at the analog node AN is reduced causes the first latch circuit 34 to output the high level latch signals LT1 to 4 (FIG. 16(*d*)). At this point in time, the clock signal to be used for creating the output clock signal OCLK is determined (the ICLK in this example). That is, during the high level period of the internal clock signal ICLK, the number of delay stages in the clock delay circuit 32 (FIG. 7) is determined which is required to create the output clock signal OCLK.

The encoder 36 shown in FIG. 11 sustains only the encode signal EN0 at a high level (FIG. 16(*e*)). The second latch circuit 40 shown in FIG. 11 latches the encode signals EN0 to 4 in synchronization with the falling edge of the latch clock signal LCLKZ, and then outputs the latched signals as the selection signals SEL0 to 4 (FIG. 16(*f*)). During the low level period (the second level period) of the internal clock signal ICLK, the selector 42 shown in FIG. 15 outputs the internal clock signal ICLK according to the high level selection signal SEL0 as the output clock signal OCLK (FIG. 16(*g*)).

Accordingly, in read operations, the I/O data buffer/register 16 shown in FIG. 1 starts outputting the data, which is read out of the memory cell MC, in synchronization with the next rising edge of the internal clock signal ICLK (tAC), and then ends the output in synchronization with the next rising edge of the internal clock signal ICLK (tOH). In the figure, the hold time tOH of output data and the access time tAC from the clock are expressed using the same rising edge of the internal clock signal ICLK. However, in practice, the hold time tOH is specified by a rising edge subsequent to the rising edge by which the access time tAC is specified.

Figure 17:
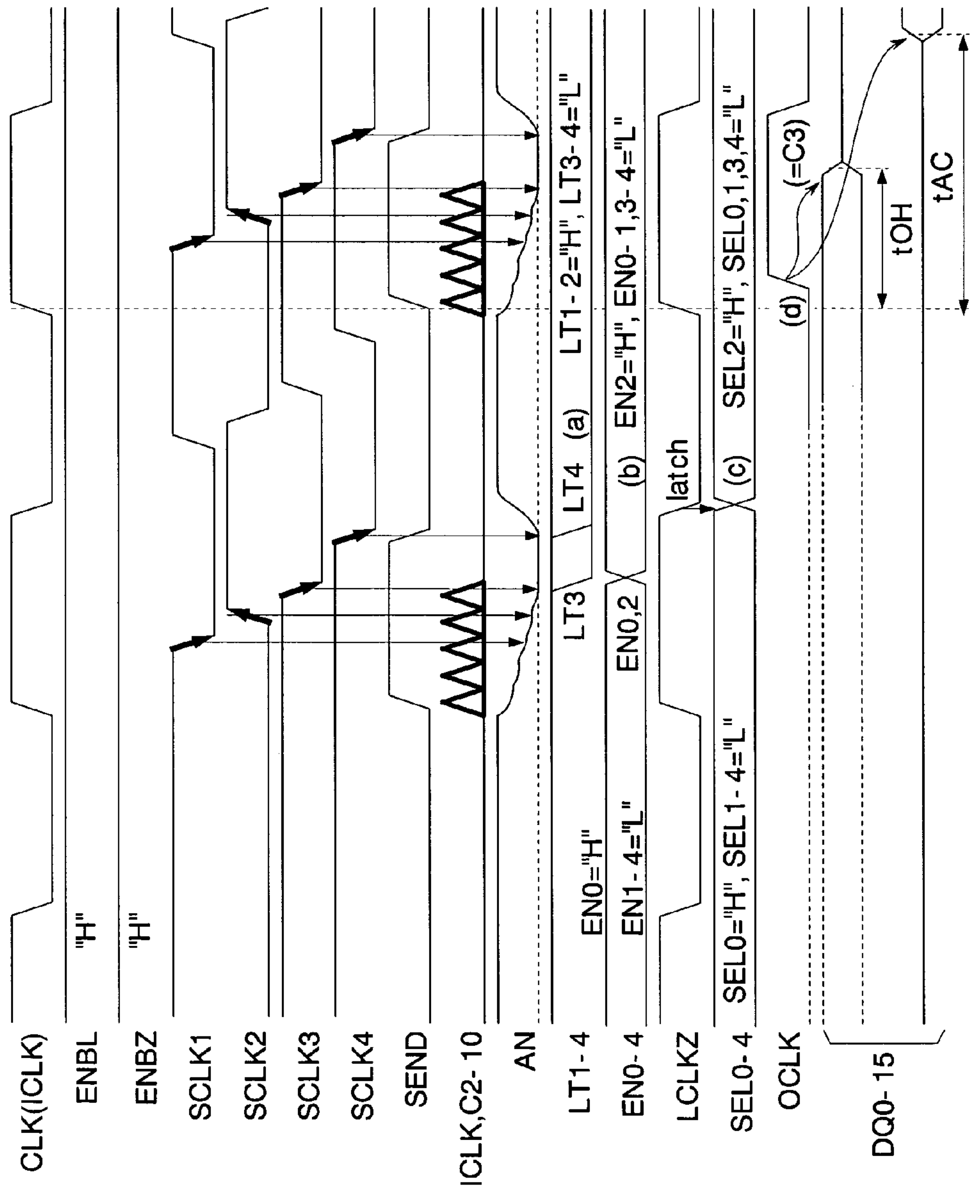
FIG. 17 is a timing diagram showing another exemplary operation of an SDRAM according to the first embodiment.

FIG. 17 shows another example of operation of the SDRAM according to the first embodiment. In this example, the transistor in the SDRAM has a standard threshold voltage (absolute value), while the control circuits such as the clock buffer 10 and the control signal latch 18 also operate at standard operating speeds.

The same process as that shown in FIG. 16 is followed until the sampling clock signals SCLK1 to 4, the sampling end signal SEND, and the delay clock signals C2 to 10 are created. The standard transistor threshold voltage (absolute value), the standard power supply voltage, or the standard operating temperature of the SDRAM will permit a larger amount of transistor current to flow than in the example shown in FIG. 16, thereby causing the voltage at the analog node AN to be reduced at a higher speed when compared with that in FIG. 16. Accordingly, the first latch circuit 34 outputs the high level latch signals LT1 to 2 and the low level latch signals LT3 to 4 (FIG. 17(*a*)). At this point in time, the clock signal to be used for generating the output clock signal OCLK is determined (C3 in this example).

The encoder 36 sustains only the encode signal EN2 at a high level (FIG. 17(*b*)). The second latch circuit 40 latches the encode signals EN0 to 4 in synchronization with the falling edge of the latch clock signal LCLKZ, and then outputs the latched signals as the selection signals SEL0 to 4 (FIG. 1*i*(c)). The selector 42 outputs the delay clock signal C3 according to the high level selection signal SEL2 as the output clock signal OCLK (FIG. 17(*d*)). Accordingly, in read operations, the I/O data buffer/register 16 starts outputting the data, which is read out of the memory cell MC, in synchronization with the rising edge of the delay clock signal C3 (tAC), and then ends the output in synchronization with the rising edge of the delay clock signal C3 (tOH).

Figure 18:
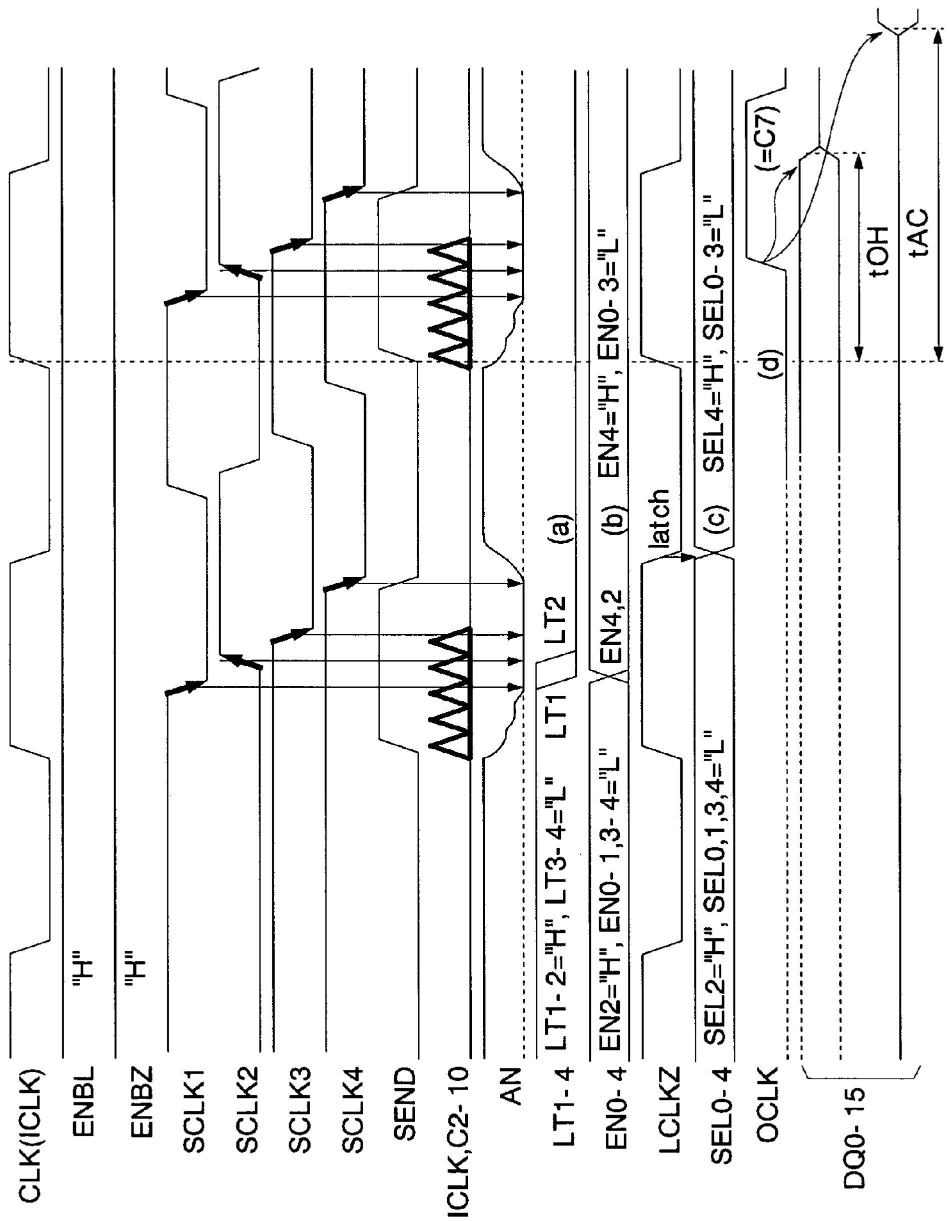
FIG. 18 is a timing diagram showing still another exemplary operation of an SDRAM according to the first embodiment.

FIG. 18 shows another example of operation of the SDRAM according to the first embodiment. This example provides the SDRAM with a low transistor threshold voltage (absolute value), while allowing the control circuits such as the clock buffer 10 and the control signal latch 18 to operate at high operating speeds.

The same process as that shown in FIG. 16 is followed until the sampling clock signals SCLK1 to 4, the sampling end signal SEND, and the delay clock signals C2 to 10 are created. A low transistor threshold voltage (absolute value), a high power supply voltage, or a low operating temperature of the SDRAM will permit a larger amount of transistor current to flow than in the example shown in FIG. 17, thereby causing the voltage at the analog node AN to be reduced at a much higher speed when compared with that in FIG. 17. Accordingly, the first latch circuit 34 outputs the low level latch signals LT1 to 4 (FIG. 18(*a*)). At this point in time, the clock signal to be used for generating the output clock signal OCLK 25, is determined (C7 in this example).

The encoder 36 sustains only the encode signal EN4 at a high level (FIG. 18(*b*)). The second latch circuit 40 latches the encode signals EN0 to 4 in synchronization with the falling edge of the latch clock signal LCLKZ, and then outputs the latched signals as the selection signals SEL0 to 4 (FIG. 18(*c*)). The selector 42 outputs the delay clock signal C7 according to the high level selection signal SEL4 as the output clock signal OCLK (FIG. 18(*d*)). Accordingly, in read operations, the I/O data buffer/register 16 starts outputting the data, which has been read out of the memory cell MC, in synchronization with the rising edge of the delay clock signal C7 (tAC), and then ends the output in synchronization with the rising edge of the delay clock signal C7 (tOH).

As shown in FIGS. 16 to 18, the lower the transistor threshold voltage (absolute value), the higher the power supply voltage, and the lower the operating temperature of the SDRAM, the lower the hold time tOH becomes. These conditions cause an increase in transistor current, allowing the control circuits formed in the SDRAM to operate at higher speeds. Accordingly, this results in a shorter hold time tOH. The present invention is applied to automatically prevent the hold time tOH from being shortened under the aforementioned conditions. It is thus possible for a system accessing the SDRAM to positively receive read data and prevent malfunction.

Figure 19:
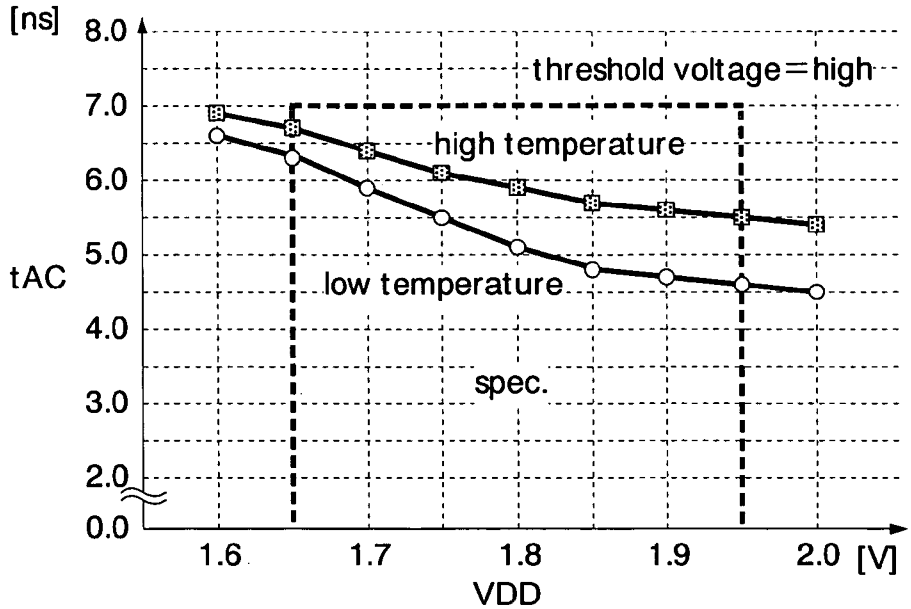
FIG. 19 is a characteristic diagram showing the dependency of tAC on power supply and temperature at a high threshold voltage.
Figure 20:
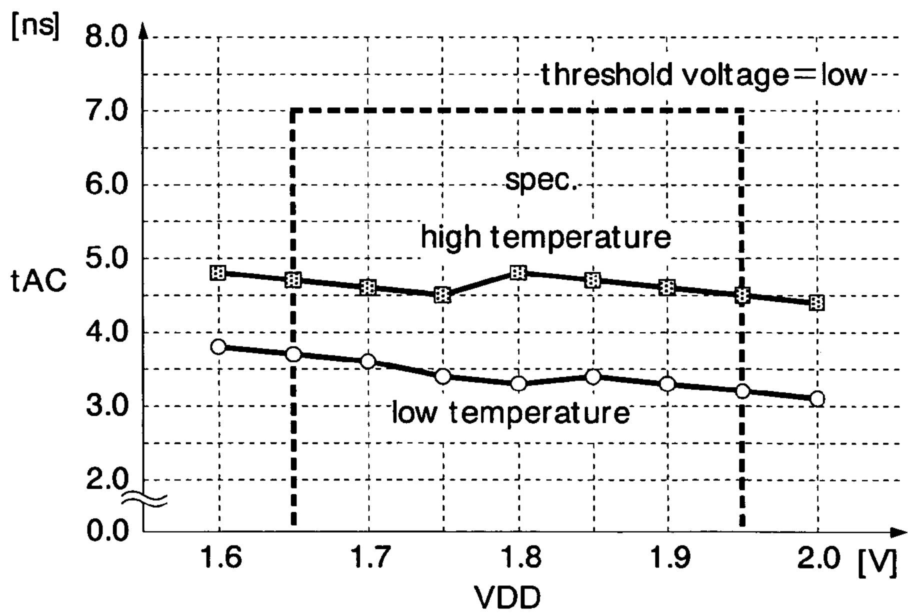
FIG. 20 is a characteristic diagram showing the dependency of tAC on power supply and temperature at a low threshold voltage.

FIG. 19 shows the dependency of tAC on the power supply and temperature at a high transistor threshold voltage. FIG. 20 shows the dependency of tAC on the power supply and temperature at a low transistor threshold voltage. The SDRAM has a maximum 7 ns access time tAC specification (spec.). It also has a 1.65 to 1.95V power supply voltage VDD specification. In the figures, the specifications are shown within the bold lines.

The access time tAC has a less margin against the specifications at a higher threshold voltage, at a lower power supply voltage VDD, and at a higher temperature. As shown in FIG. 20, under a high temperature, the access time tAC increases when the power supply voltage VDD changes from 1.75V to 1.8V. This occurs because the timing adjustment circuit 24 according to the present invention has changed the delay clock signal used for the output clock signal OCLK, e.g., from C3 to C4. This change causes the access time tAC to be reduced in margin. However, there will be no problem because the worst condition for the access time tAC is a high threshold voltage.

Figure 21:
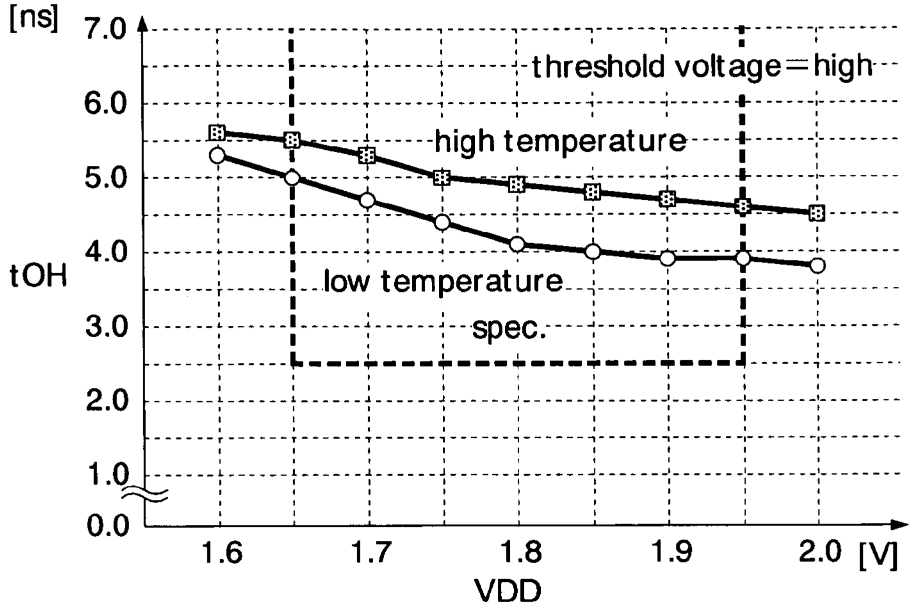
FIG. 21 is a characteristic diagram showing the dependency of tOH on power supply and temperature at a high threshold voltage.
Figure 22:
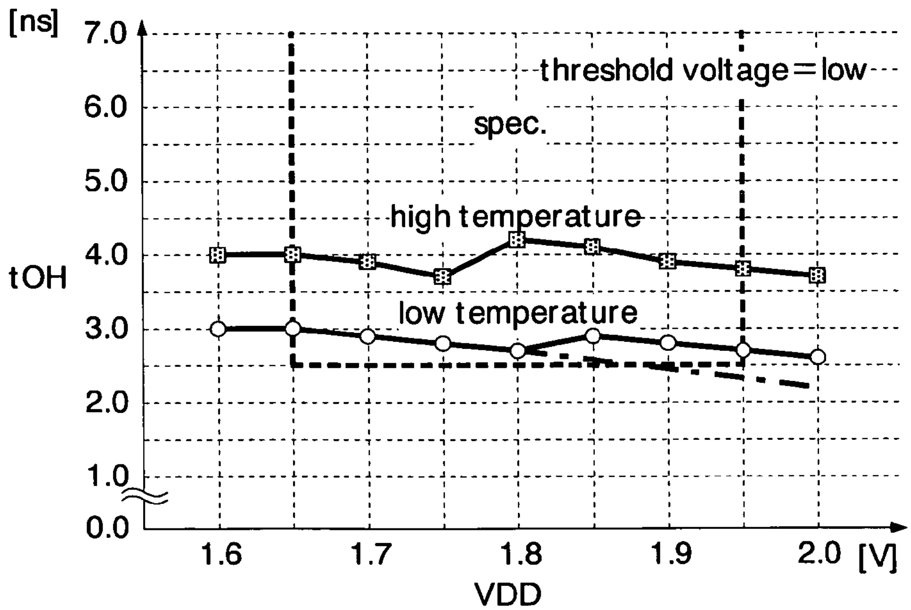
FIG. 22 is a characteristic diagram showing the dependency of tOH on power supply and temperature at a low threshold voltage.

FIG. 21 shows the dependency of tOH on the power supply and temperature at a high transistor threshold voltage. FIG. 22 shows the dependency of tOH on the power supply and temperature at a low transistor threshold voltage. The SDRAM has a minimum 2.5 ns hold time tOH specification (spec.). It also has a 1.65 to 1.95V power supply voltage VDD specification. In the figures, the specifications are shown within the bold lines.

The hold time tOH has a less margin against the specifications at a lower threshold voltage, at a higher power supply voltage VDD, and at a lower temperature. As shown in FIG. 22, the hold time tOH increases when the power supply voltage VDD changes from 1.75V to 1.8V (at a high temperature) or from 1.8V to 1.85V (at a low temperature). This occurs because the timing adjustment circuit 24 according to the present invention has changed the delay clock signal used for the output clock signal OCLK, e.g., from C3 to C4. This change causes the hold time tOH to be increased in margin. As shown in FIG. 22 by alternate long and short dashed lines, an SDRAM to which the present invention is not applied has a hold time tOH shorter than 2.5 ns and thus does not satisfy the specifications at a low temperature and high power supply voltage VDD. That is, the SDRAM is defective. The present invention prevents the specifications from being unsatisfied under the worst condition as well as the yield from being reduced. This leads to a reduction in manufacturing costs.

As described above, this embodiment allows for automatically optimally setting the output timing of the read data DQ0 to 15 depending on the threshold voltage, the operating temperature, and the power supply voltage. This leads to improvements in operation margin of the SDRAM (particularly, the hold time tOH) and in manufacturing yield. It is also possible to improve the operation margin of a system accessing the SDRAM.

The delay clock signals C2 to C10 generated by the clock delay circuit 32 can be used to set the ON period of the pair of nMOS transistors in the analog delay circuit 30, thereby gradually removing the charges at the analog node AN. Since the rate of change in voltage at the analog node AN can be reduced, it is possible to make fine adjustments to the output timing of the read data DQ0 to 15 in response to a subtle change in threshold voltage, operating temperature, and power supply voltage.

Using the sampling clock signals SCLK1 to 4 having different timings from each other, the first latch circuit 34 can sequentially detect the voltage at the analog node AN as a logic value, thereby allowing for combining the detected logic values to facilitate the determination of the speed of discharging the analog node AN.

The second latch circuit 40 can hold the encode signals EN0 to 4, thereby allowing the analog delay circuit 30, the first latch circuit 34, and the encoder 36 to start preparing for the subsequent operation before the selector 42 selects the clock signal. Accordingly, it is possible to shorten the adjustment cycle of delay time, and the time required from a change in operating temperature and power supply voltage until the output timing of the read data DQ0 to 15 is changed.

Any one of the encode signals EN0 to 4 output by the encoder 36 can be always enabled, thereby preventing the selector 42 from selecting none of the clock signals. As a result, it is possible to prevent the malfunction of the SDRAM of not outputting the read data DQ0 to 15.

It is possible to reduce the power consumption of the SDRAM by allowing the sampling clock delaying circuit 28, the clock delay circuit 32, and the first latch circuit 34 to operate only while the enable signal ENBL (ENBZ and ENBX) is enabled.

In the first latch circuit 34, the threshold voltage (absolute value) of the transistor subjected to analog voltage AN can be set to be lower than the threshold voltage of the other transistors formed in the SDRAM. This allows for reducing the time required for detecting the analog voltage AN, thereby reducing the state in which the output is not at a high level nor low level (dead zone).

The second latch circuit 40 can be operated in synchronization with the sampling end signal SEND, thereby ensuring that the second latch circuit 40 latches the encode signals EN0 to 4 produced according to the speed of discharging the analog node AN.

The sampling clock signals SCLK1 to 4 are sequentially produced during the high level period of the internal clock signal ICLK, while the delay clock signal for producing the output clock signal OCLK is selected during the low level period of the internal clock signal ICLK. That is, the operations required from the detection of a change in operating temperature and power supply voltage to the adjustment of the timing of the output clock signal OCLK can be quickly performed in one cycle of the clock signal CLK.

The delay clock signals C3, C5, and C7 can also be used as a clock signal selected by the selector 42 to eliminate the need of a circuit for creating the clock signal selected by the selector 42, thereby reducing the circuit scale of the SDRAM. This in turn makes it possible to reduce the chip size of the SDRAM and thus the manufacturing costs.

Figure 23:
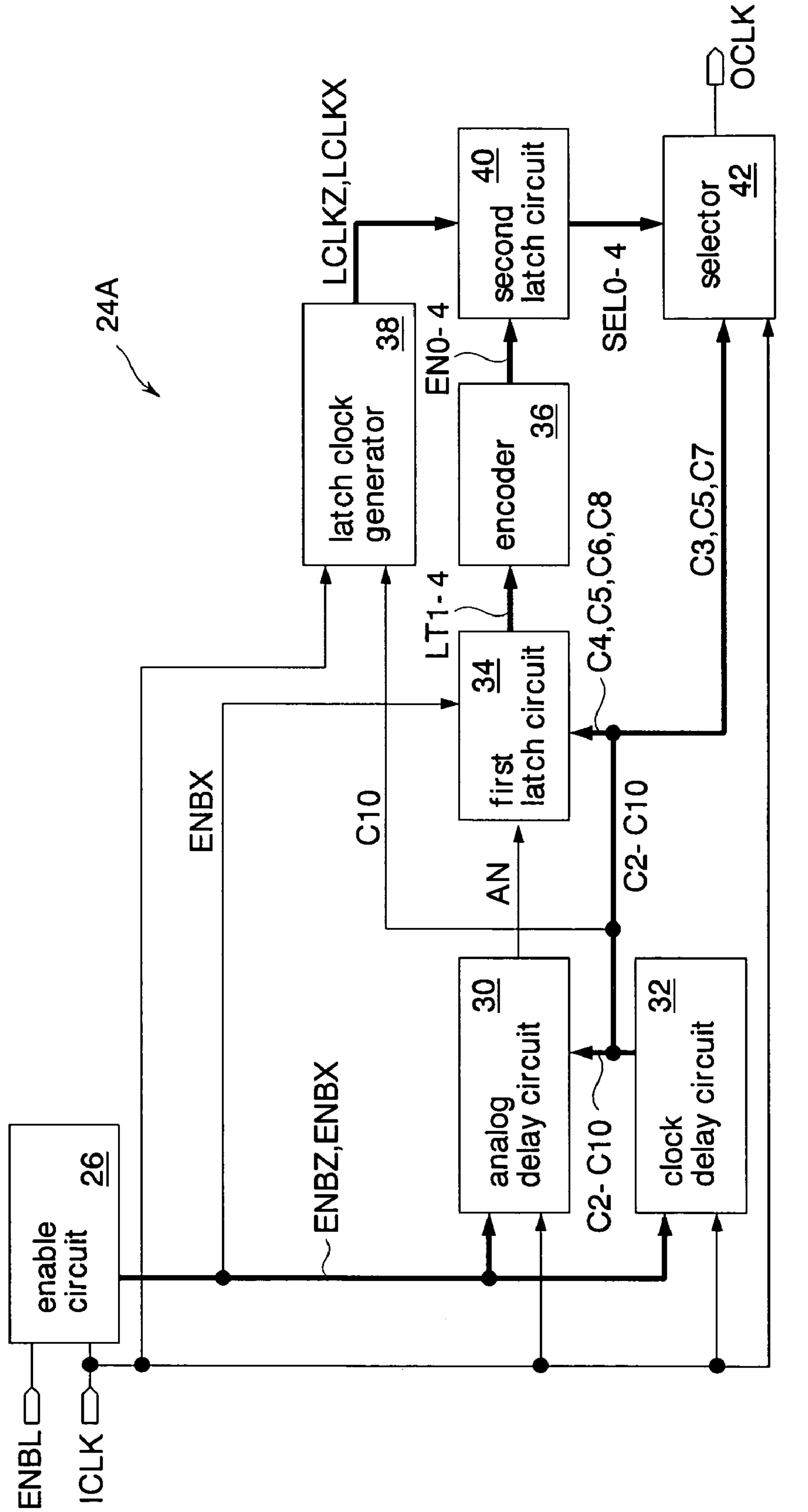
FIG. 23 is a detailed block diagram showing a timing-adjustment circuit in a semiconductor integrated circuit according to a second embodiment of the present invention.

FIG. 23 shows a timing adjustment circuit 24A of a semiconductor integrated circuit according to a second embodiment of the present invention. The semiconductor integrated circuit is formed on a silicon substrate as a clock synchronous SDRAM using the CMOS process. The entire circuit except for the timing adjustment circuit 24A is the same as that of the first embodiment. The same symbols are given to the same components as those described with reference to the first embodiment and will not be detailed again.

The timing adjustment circuit 24A is configured such that the sampling clock delaying circuit 28 is eliminated in the timing adjustment circuit 24 of the first embodiment. The analog delay circuit 30 and the latch clock generator 38 receive the delay clock signal C10 in place of the sampling end signal SEND of the first embodiment. The first latch circuit 34 receives the delay clock signals C4, C5, C6, and C8 in place of the sampling clock signals SCLK1 to 4 of the first embodiment. That is, the first latch circuit 34 detects (latches) the voltage value at the analog node AN as a logic value in synchronization with the delay clock signals C4, C5, C6, and C8. The other configuration is the same as that of the timing adjustment circuit 24 of the first embodiment.

In this embodiment, the same effects as those of the aforementioned first embodiment can also be obtained. Furthermore, in this embodiment, the delay clock signals C4, C5, C6, and C8 can also be used as a latch signal of the first latch circuit 34, thereby eliminating the need of the sampling clock delaying circuit 28 of the first embodiment. This makes it possible to reduce the circuit scale, thereby reducing the chip size of the SDRAM and thus the manufacturing costs.

In the aforementioned embodiments, such examples have been described in which the present invention is applied to the SDRAM. However, the present invention is not limited to such an embodiment. For example, the present invention may also be applied other semiconductor memories which operate in synchronization with a clock or system LSIs or the like. Furthermore, the circuit to which the present invention is applied is not limited to data output circuits. The present invention is applicable to various circuits which operate in synchronization with a clock signal or a timing signal.

In the aforementioned embodiments, such an example has been described in which a PMOS transistor is used to pre-charge the analog node AN while an nMOS transistors is used to discharge the analog node AN. However, the present invention is not limited to such an embodiment. For example, an nMOS transistors may be used to discharge the analog node AN and then a pMOS transistor may be used to gradually pre-charge the analog node AN. At this time, the analog delay circuit (corresponding to the one in FIG. 9) is provided with a plurality of pairs of pMOS transistors connected between the power supply voltage VDD and the analog node AN, and an nMOS transistors connected between the ground line VSS and the analog node AN. Each pair of pMOS transistors utilizes the low level overlapping periods of the delay clock signals C2 and C3 (C4 and 5, C6 and 7, C8 and 9 or etc.) to gradually pre-charge the analog node AN which has been discharged to the ground voltage VSS.

In the aforementioned embodiments, such an example has been described in which the delay time of the clock signal CLK is adjusted according to the present invention. However, the present invention is not limited to such an embodiment. For example, the delay time of a timing signal having a transition edge can be adjusted according to the present invention.

The invention is not limited to the above embodiments and various modifications may be made without departing from the spirit and scope of the invention. Any improvement may be made in part or all of the components.

What is claimed is:

1. A semiconductor integrated circuit comprising:

a first transistor disposed between a first node and a first power supply line, and pre-charging said first node to a first power supply voltage;

a plurality of pairs of second transistors discharging electric charges at said first node which has been pre-charged to the first power supply voltage, each of the pairs of second transistors being disposed in series between said first node and a second power supply line;

a timing signal delaying circuit having a plurality of delay stages connected in cascade, and generating a plurality of delayed timing signals obtained by sequentially inverting a first timing signal received at a first stage;

a plurality of detection circuits operating at timings different from each other, each of which detects a voltage at said first node as a logic value;

a selector selecting any one of a plurality of second timing signals depending on a detection result provided by said detection circuits, and an internal circuit operating in synchronization with a second timing signal selected by said selector, wherein gates of each of said pairs of second transistors receive one and the other of a pair of said delayed timing signals whose rising edge and falling edge are adjacent to each other, respectively, and the pair of said delayed timing signals received by each of said pairs of second transistors are different from each other.

2. The semiconductor integrated circuit according to claim 1, further comprising a sampling signal delaying circuit sequentially delaying said first timing signal to generate a plurality of sampling timing signals, and wherein said detection circuits each detects a voltage at said first node as a logic value in synchronization with said sampling timing signals different from each other.

3. The semiconductor integrated circuit according to claim 2, further comprising a plurality of latch circuits disposed between said detection circuits and said selector, and latching a detection result provided by said detection circuits.

4. The semiconductor integrated circuit according to claim 3, wherein said latch circuits latch the detection result provided by said detection circuits in synchronization with a sampling end signal which is the latest one of said sampling timing signals.

5. The semiconductor integrated circuit according to claim 4, wherein said first timing signal is a clock signal, said sampling signal delaying circuit sequentially generates said sampling timing signals during a first level period of said clock signal, said selector selects any one of said second timing signals during a second level period of said clock signal, and said internal circuit operates in synchronization with one of said second timing signals selected by said selector, from a first level period subsequent to the second level period during which any of said second timing signals is selected.

6. The semiconductor integrated circuit according to claim 3, further comprising an encoder disposed between said detection circuits and said latch circuits, encoding the detection result provided by said detection circuits to enable any one of a plurality of encode signals, and outputting said plurality of encode signals to said latch circuits, respectively, wherein said encoder includes a disable timing delaying circuit delaying a disable timing of an enabled encode signal relative to an enable timing of one of the encode signals to be enabled.

7. The semiconductor integrated circuit according to claim 2, further comprising an enable circuit receiving an enable signal during a first level period of said first timing signal which is a clock signal, and outputting the enable signal received during a second level period of said clock signal, and wherein said sampling signal delaying circuit starts operating in response to said enable signal being output from said enable circuit.

8. The semiconductor integrated circuit according to claim 1, wherein said detection circuits detect a voltage at said first node as logic values in synchronization with said delayed timing signals different from each other.

9. The semiconductor integrated circuit according to claim 1, wherein said second timing signals received by said selector is said delayed timing signals.

10. The semiconductor integrated circuit according to claim 1, wherein said detection circuits each includes a transistor having a gate connected to said first node and a drain outputting a voltage corresponding to said logic value, and said transistor has a threshold voltage whose absolute value is set to be lower than a threshold voltage of other transistors formed in the semiconductor integrated circuit.

11. The semiconductor integrated circuit according to claim 1, wherein said first timing signal is a clock signal.

12. The semiconductor integrated circuit according to claim 1, further comprising an enable circuit receiving an enable signal during a first level period of said first timing signal which is a clock signal, and outputting the enable signal received during a second level period of said clock signal, and wherein said timing signal delaying circuit starts operating in response to said enable signal being output from said enable circuit.

13. The semiconductor integrated circuit according to claim 1, further comprising a memory core having a plurality of memory cells, and wherein said internal circuit is a data output circuit outputting data being read out from said memory cells, in synchronization with a selected one of said second timing signals.

* * * * *